(12) United States Patent
Jo et al.

(10) Patent No.: US 12,053,073 B2
(45) Date of Patent: Aug. 6, 2024

(54) DECORATION MEMBER AND METHOD FOR MANUFACTURING SAME

(71) Applicant: LG CHEM, LTD., Seoul (KR)

(72) Inventors: Pilsung Jo, Daejeon (KR); Jin Suk Song, Daejeon (KR); Sangcholl Han, Daejeon (KR); Ki Hwan Kim, Daejeon (KR); Yong Chan Kim, Daejeon (KR); Nansra Heo, Daejeon (KR); Jeong Woo Shon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 931 days.

(21) Appl. No.: 16/980,289

(22) PCT Filed: Apr. 9, 2019

(86) PCT No.: PCT/KR2019/004234
§ 371 (c)(1),
(2) Date: Sep. 11, 2020

(87) PCT Pub. No.: WO2019/199036
PCT Pub. Date: Oct. 17, 2019

(65) Prior Publication Data
US 2021/0053389 A1    Feb. 25, 2021

(30) Foreign Application Priority Data

Apr. 10, 2018 (KR) .................. 10-2018-0041562
Aug. 31, 2018 (KR) .................. 10-2018-0103927

(51) Int. Cl.
*B44F 1/08* (2006.01)
*A45D 33/18* (2006.01)
(Continued)

(52) U.S. Cl.
CPC ............. *A45D 33/18* (2013.01); *A45D 34/00* (2013.01); *A45D 40/00* (2013.01);
(Continued)

(58) Field of Classification Search
CPC ........ A45D 33/18; A45D 34/00; A45D 40/00; A45D 2034/007; A45D 2040/0012;
(Continued)

(56) References Cited

U.S. PATENT DOCUMENTS 3,338,730 A    8/1967    Slade et al.
3,684,348 A    8/1972    Rowland
(Continued)

FOREIGN PATENT DOCUMENTS

CN    2056903 U    5/1990
CN    1235678 A    11/1999
(Continued)

OTHER PUBLICATIONS

Color Difference and Formulas Abstract Oct. 29, 2020.

*Primary Examiner* — David Sample
*Assistant Examiner* — Donald M Flores, Jr.
(74) *Attorney, Agent, or Firm* — BRYAN CAVE LEIGHTON PAISNER LLP

(57) ABSTRACT

The present application relates to a decoration member including a pattern layer provided on one surface of the substrate and including a convex structure or a concave structure arranged two-dimensionally, and a method for preparing the decoration member.

19 Claims, 26 Drawing Sheets

(51) Int. Cl.
| | | |
|---|---|---|
| *A45D 34/00* | (2006.01) | |
| *A45D 40/00* | (2006.01) | |
| *B29C 45/00* | (2006.01) | |
| *B29C 45/26* | (2006.01) | |
| *B32B 3/30* | (2006.01) | |
| *B32B 7/023* | (2019.01) | |
| *B32B 15/08* | (2006.01) | |
| *B32B 27/06* | (2006.01) | |
| *B44F 1/02* | (2006.01) | |
| *C01B 21/082* | (2006.01) | |
| *C08J 7/04* | (2020.01) | |
| *G02B 5/00* | (2006.01) | |
| *G02B 5/22* | (2006.01) | |
| *B29C 45/16* | (2006.01) | |
| *B29K 101/00* | (2006.01) | |
| *B65D 1/02* | (2006.01) | |
| *C23C 14/00* | (2006.01) | |

(52) U.S. Cl.
CPC ......... *B29C 45/0001* (2013.01); *B29C 45/26* (2013.01); *B32B 3/30* (2013.01); *B32B 7/023* (2019.01); *B32B 15/08* (2013.01); *B32B 27/06* (2013.01); *B44F 1/02* (2013.01); *B44F 1/08* (2013.01); *C01B 21/0825* (2013.01); *C08J 7/0423* (2020.01); *G02B 5/003* (2013.01); *G02B 5/223* (2013.01); *A45D 2034/007* (2013.01); *A45D 2040/0012* (2013.01); *A45D 2200/053* (2013.01); *B29C 45/1679* (2013.01); *B29K 2101/00* (2013.01); *B29K 2901/12* (2013.01); *B29K 2995/002* (2013.01); *B32B 2255/28* (2013.01); *B32B 2307/4026* (2013.01); *B32B 2307/416* (2013.01); *B32B 2439/40* (2013.01); *B32B 2451/00* (2013.01); *B65D 1/0207* (2013.01); *C08J 2367/02* (2013.01); *C23C 14/0036* (2013.01)

(58) Field of Classification Search
CPC ......... B44F 1/02; B44F 1/08; C01B 21/0825; G02B 5/003; B29C 45/1679
See application file for complete search history.

(56) References Cited

U.S. PATENT DOCUMENTS

| | | | |
|---|---|---|---|
| 5,734,501 A * | 3/1998 | Smith | G02B 5/124 359/530 |
| 7,923,122 B2 | 4/2011 | Korechika et al. | |
| 8,287,994 B2 | 10/2012 | Fukawa et al. | |
| 8,613,822 B2 | 12/2013 | Van Nutt et al. | |
| 2003/0035972 A1 | 2/2003 | Hanson et al. | |
| 2004/0012966 A1 | 1/2004 | Takasaki et al. | |
| 2004/0013805 A1 | 1/2004 | Nagata et al. | |
| 2005/0063067 A1 | 3/2005 | Phillips et al. | |
| 2005/0208389 A1 | 9/2005 | Ishibashi et al. | |
| 2006/0275625 A1 | 12/2006 | Lieberman | |
| 2006/0285184 A1 | 12/2006 | Phillips et al. | |
| 2008/0131693 A1 | 6/2008 | Hiruma et al. | |
| 2008/0206495 A1 * | 8/2008 | Korechika | G02B 5/09 428/30 |
| 2010/0060987 A1 * | 3/2010 | Witzman | B42D 25/36 427/162 |
| 2010/0128204 A1 | 5/2010 | Omote et al. | |
| 2011/0053057 A1 | 3/2011 | Nozawa | |
| 2011/0199685 A1 | 8/2011 | Ito | |
| 2011/0273356 A1 | 11/2011 | Kawaguchi et al. | |
| 2011/0308693 A1 | 12/2011 | Van Nutt et al. | |
| 2012/0140316 A1 | 6/2012 | Suzuki et al. | |
| 2012/0196095 A1 | 8/2012 | Tanida et al. | |
| 2012/0300306 A1 | 11/2012 | Nagahama et al. | |
| 2015/0064469 A1 | 3/2015 | Takazaki | |
| 2015/0212244 A1 | 7/2015 | Kim et al. | |
| 2017/0015802 A1 | 1/2017 | Hall et al. | |
| 2017/0052295 A1 | 2/2017 | Sakuma et al. | |
| 2018/0033893 A1 | 2/2018 | Lee et al. | |
| 2018/0267638 A1 | 9/2018 | Yoon et al. | |
| 2019/0098946 A1 | 4/2019 | Bee et al. | |
| 2019/0099979 A1 * | 4/2019 | Bee | D06P 1/44 |
| 2019/0153776 A1 | 5/2019 | Arima et al. | |
| 2021/0124100 A1 | 4/2021 | Kim et al. | |

FOREIGN PATENT DOCUMENTS

| | | |
|---|---|---|
| CN | 1461963 A | 12/2003 |
| CN | 101642005 A | 2/2010 |
| CN | 101666886 A | 3/2010 |
| CN | 102282288 A | 12/2011 |
| CN | 102289017 A | 12/2011 |
| CN | 102741714 A | 10/2012 |
| CN | 104220634 A | 12/2014 |
| CN | 104602909 A | 5/2015 |
| CN | 106457753 A | 2/2017 |
| CN | 107112075 A | 8/2017 |
| CN | 107407846 A | 11/2017 |
| EP | 2192428 A1 | 6/2010 |
| EP | 2420391 A2 | 2/2012 |
| EP | 2891554 A1 | 7/2015 |
| EP | 3593991 A1 | 1/2020 |
| JP | S55-159964 A | 12/1980 |
| JP | 62-146624 A | 6/1987 |
| JP | 5-208446 A | 8/1993 |
| JP | 2000-47613 A | 2/2000 |
| JP | 2001-503879 A | 3/2001 |
| JP | 2003265226 A | 9/2003 |
| JP | 2004-106490 A | 4/2004 |
| JP | 2006-350355 A | 12/2006 |
| JP | 2008-62562 A | 3/2008 |
| JP | 2008-201104 A | 9/2008 |
| JP | 2009-089843 A | 4/2009 |
| JP | 2009-131998 A | 6/2009 |
| JP | 2009-186929 A | 8/2009 |
| JP | 2010-173273 A | 8/2010 |
| JP | 2010-188713 A | 9/2010 |
| JP | 2010-197798 A | 9/2010 |
| JP | 2011-16291 A | 1/2011 |
| JP | 2011-56683 A | 3/2011 |
| JP | 2011-140136 A | 7/2011 |
| JP | 2011-170295 A | 9/2011 |
| JP | 2011-173379 A | 9/2011 |
| JP | 2011-186414 A | 9/2011 |
| JP | 2013223928 A | 10/2013 |
| JP | 2015-68849 A | 4/2015 |
| JP | 2015-101024 A | 6/2015 |
| JP | 2015210319 A | 11/2015 |
| JP | 2015533678 A | 11/2015 |
| JP | 2016010569 A | 1/2016 |
| JP | 2016-40667 A | 3/2016 |
| JP | 2017-0191305 A | 10/2017 |
| JP | 2017-191305 A | 10/2017 |
| KR | 10-2008-0078523 A | 8/2008 |
| KR | 10-2009-0099858 A | 9/2009 |
| KR | 10-2010-0135837 A | 12/2010 |
| KR | 10-2012-0065068 A | 6/2012 |
| KR | 10-2013-0048718 A | 5/2013 |
| KR | 10-2017-0133109 A | 12/2017 |
| TW | 201022051 A | 6/2010 |
| TW | 201038330 A1 | 11/2010 |
| WO | 9533392 A1 | 12/1995 |
| WO | 2014173974 A2 | 10/2014 |

\* cited by examiner

【FIG. 1】

| 100 |
|---|
| 200 |
| 300 |
| 400 |

【FIG. 2】

| 100 |
|---|
| 400 |
| 200 |
| 300 |
| 400 |

【FIG. 3】

| 100 |
|---|
| 200 |
| 400 |
| 300 |
| 400 |

[FIG. 4]
| 100 |
| --- |
| 200 |
| 301 |
| 302 |
| 400 |
[FIG. 5]
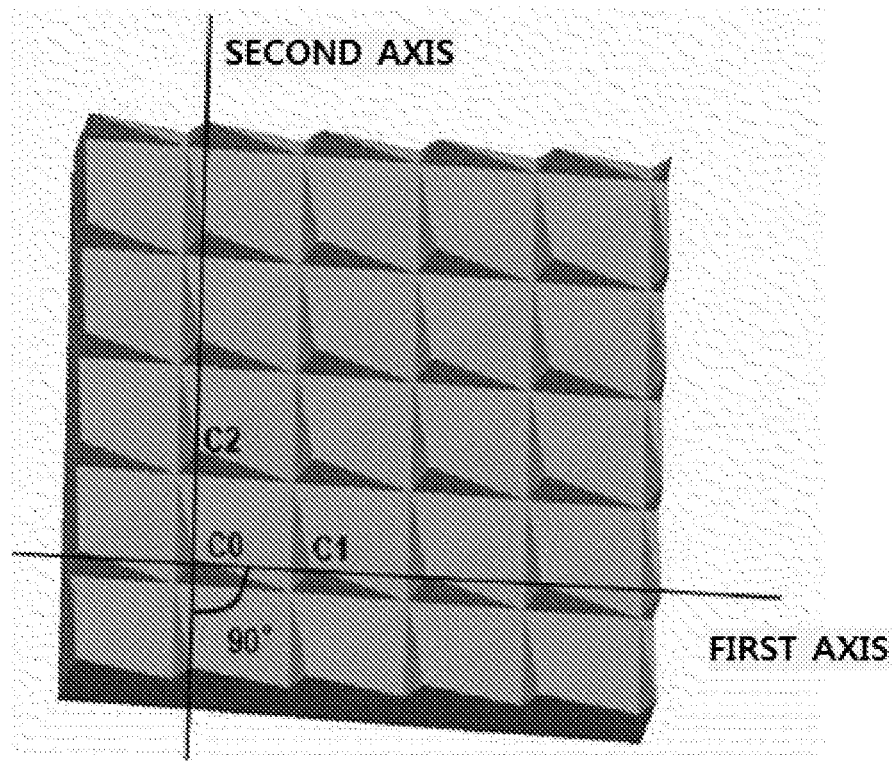

[FIG. 6]
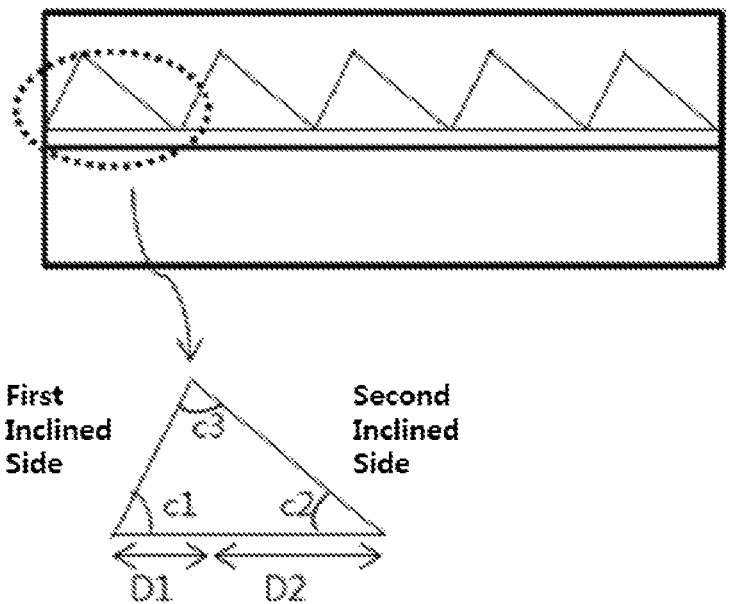
[FIG. 7]
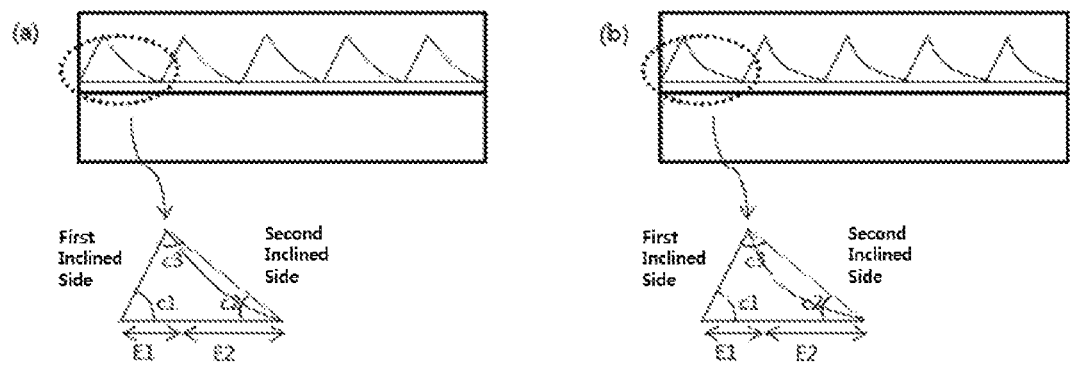

[FIG. 8]
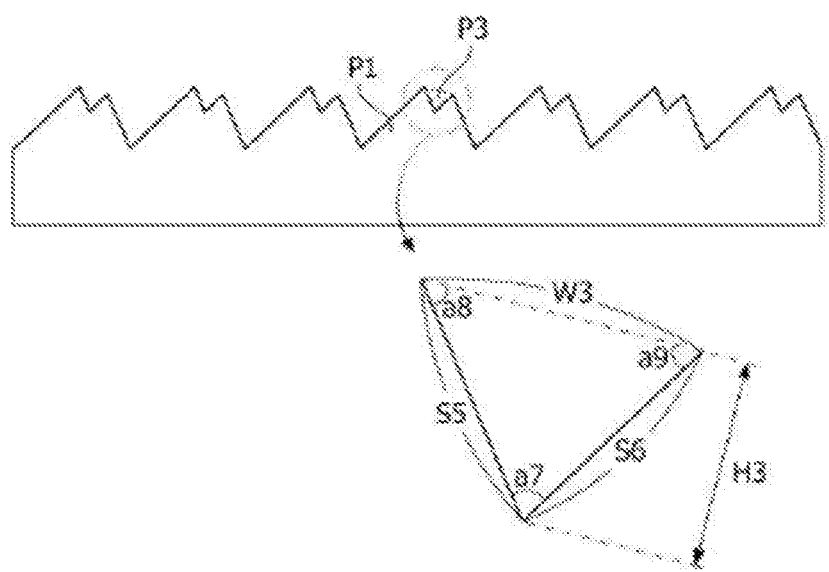

[FIG. 9]
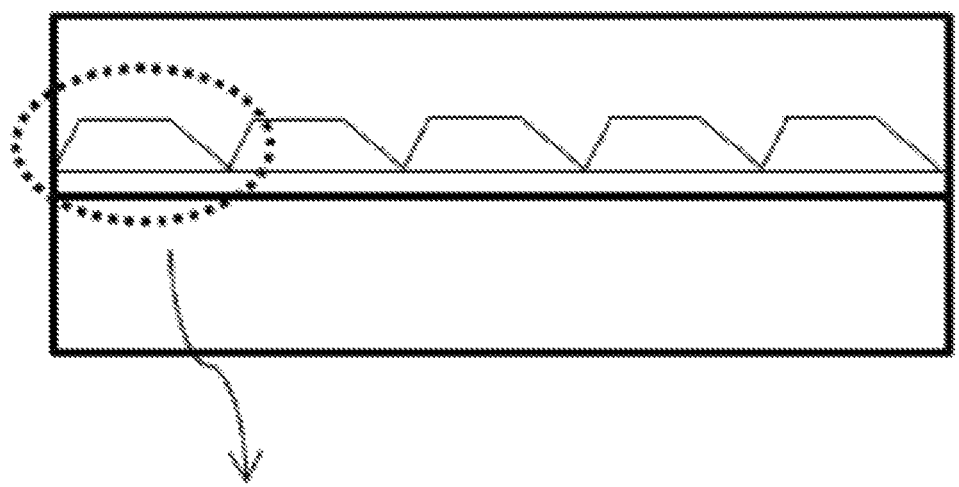
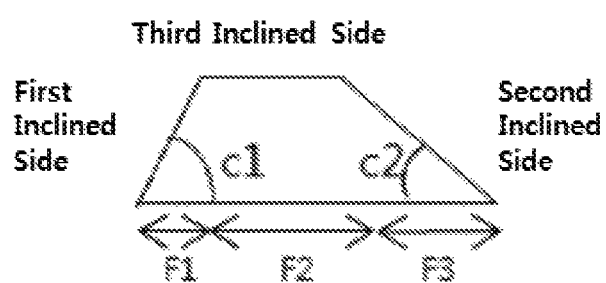

[FIG. 10]
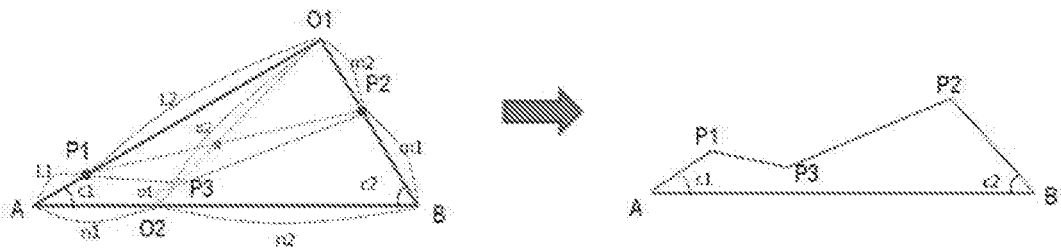
[FIG. 11]
[FIG. 12]
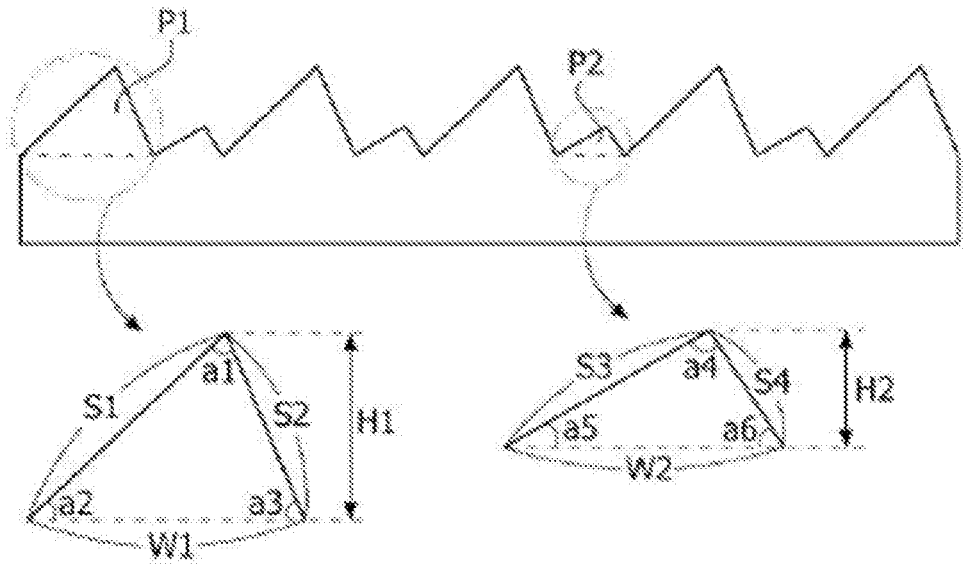

[FIG. 13]
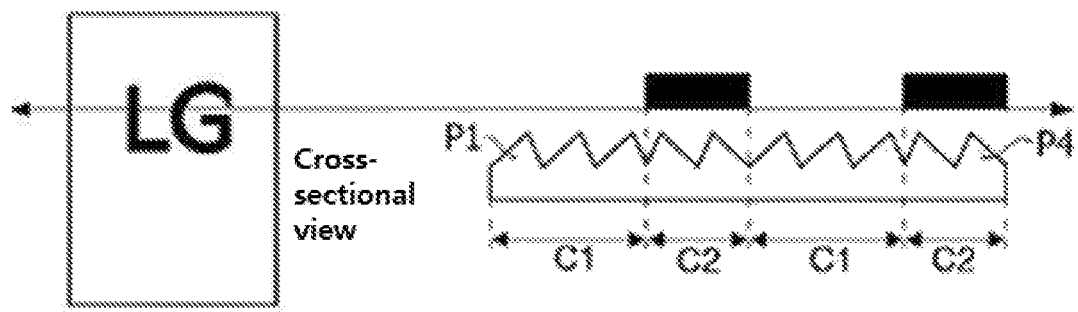
(a)
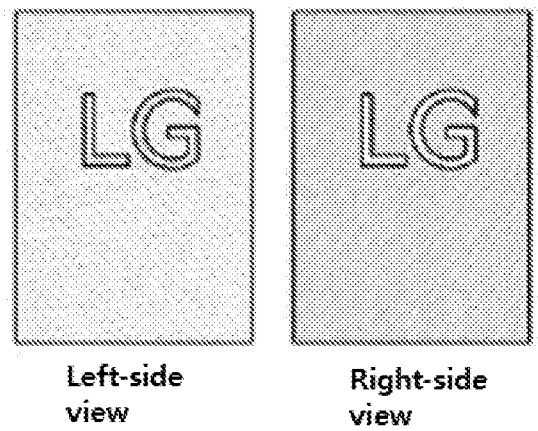
(b)

【FIG. 14】
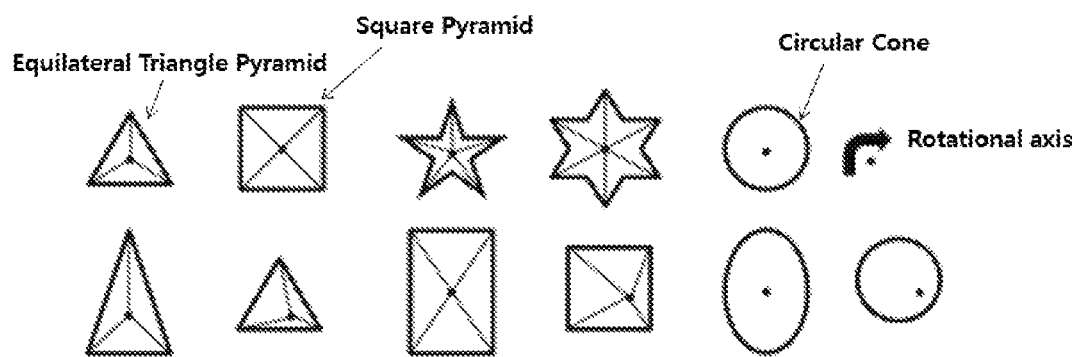
【FIG. 15】
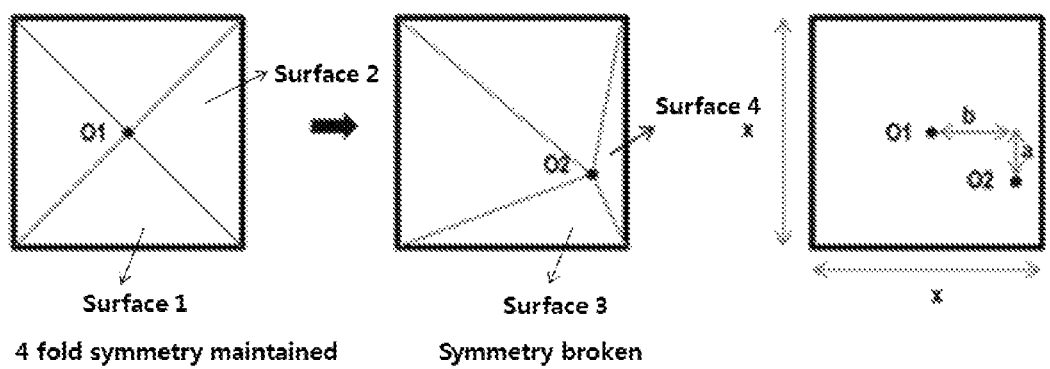

[FIG. 16]
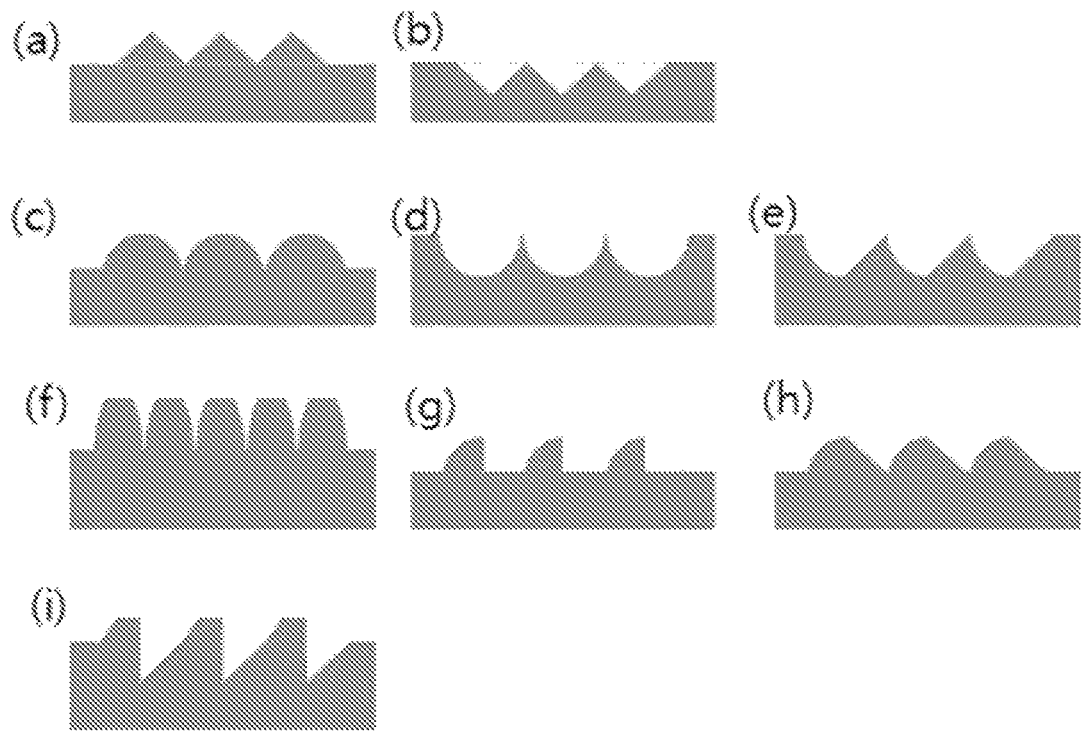
[FIG. 17]
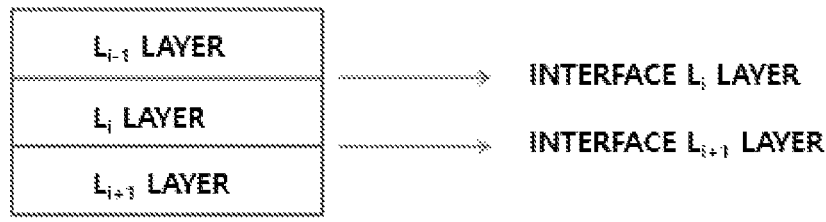

[FIG. 18]
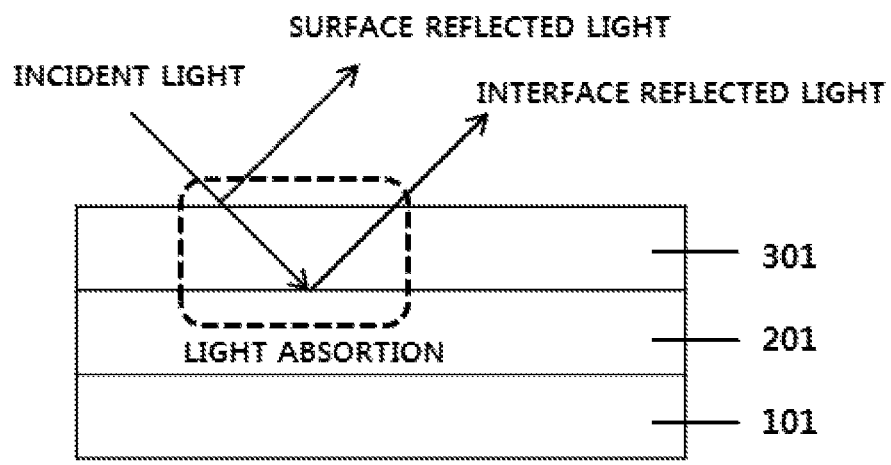

[FIG. 19]
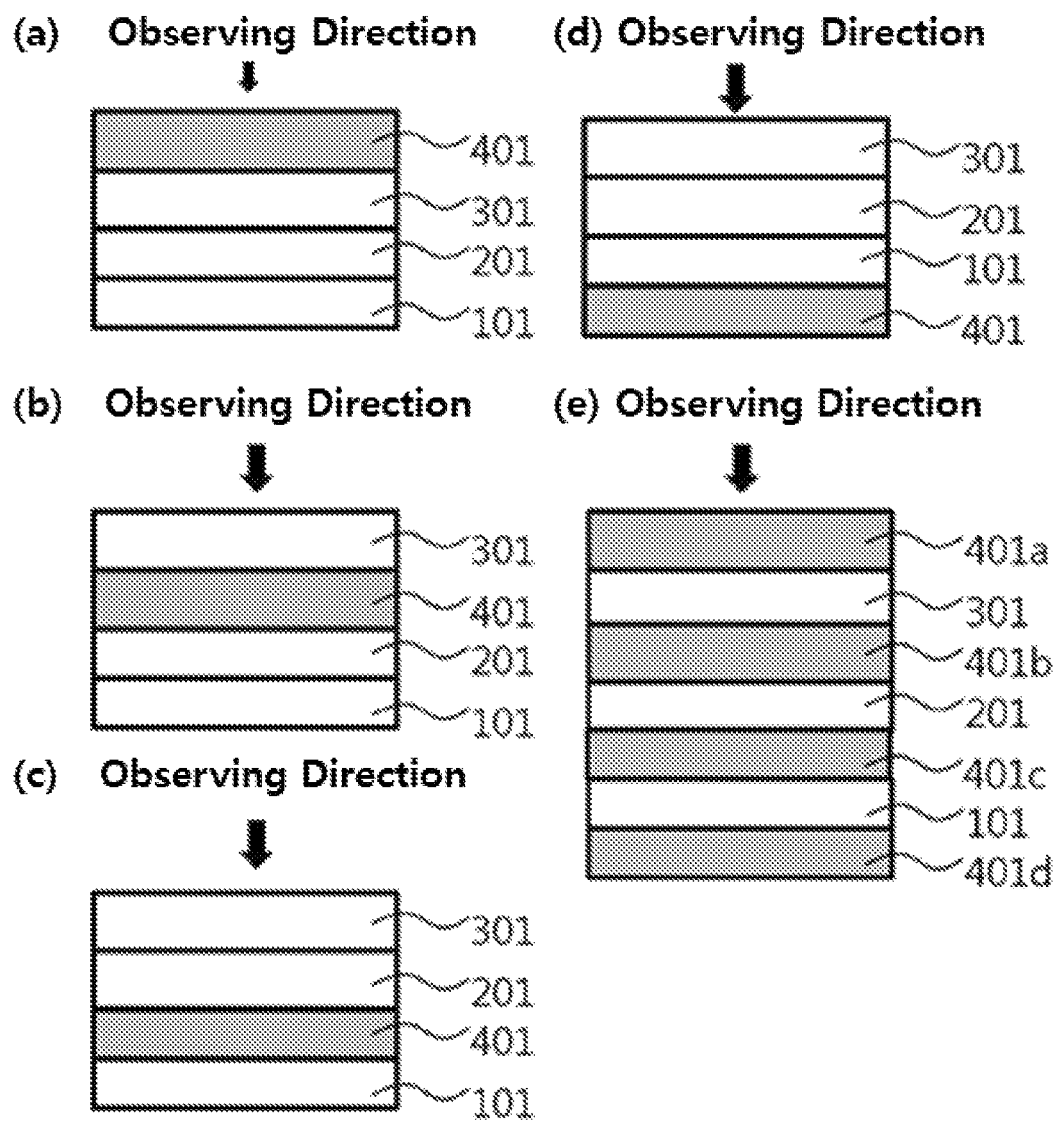

[FIG. 20]
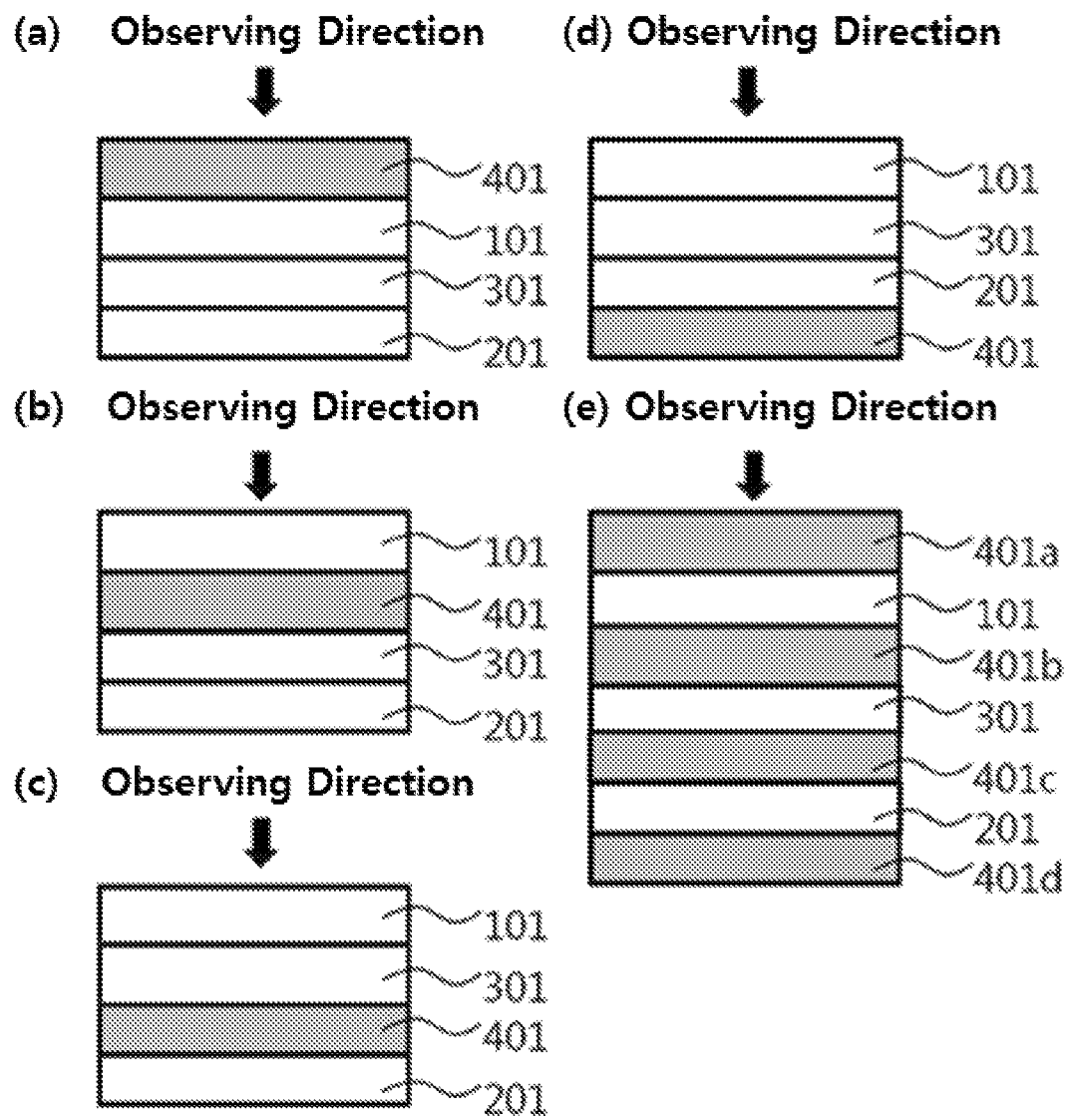

[FIG. 21]
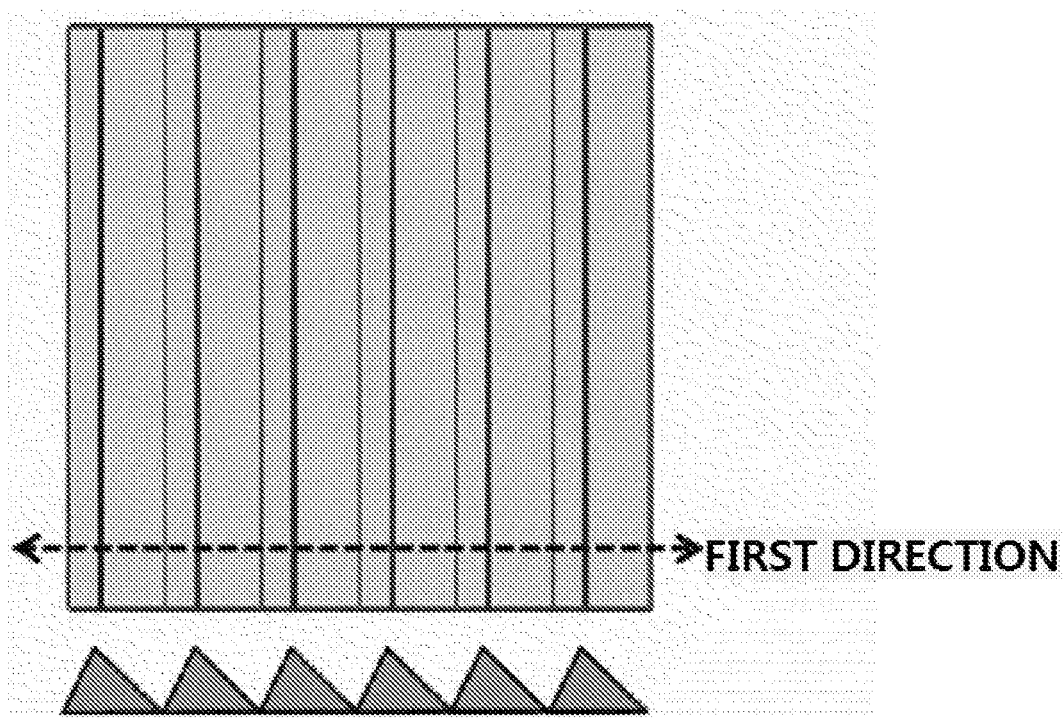

[FIG. 22]
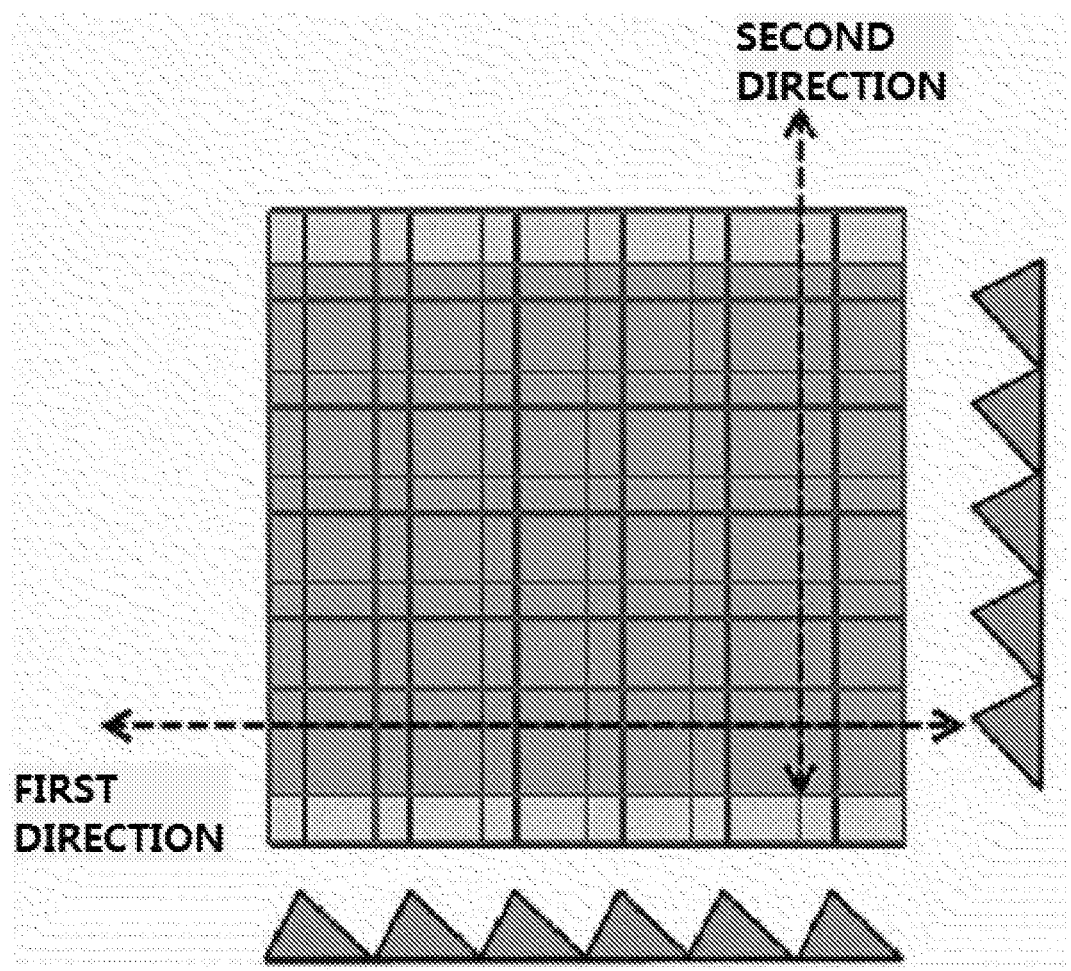

[FIG. 23]
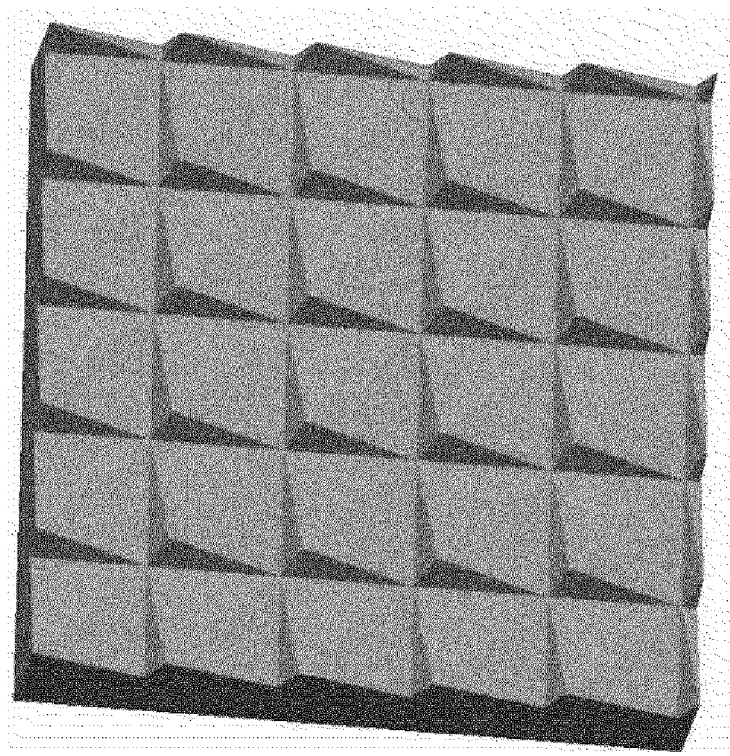

[FIG. 24]
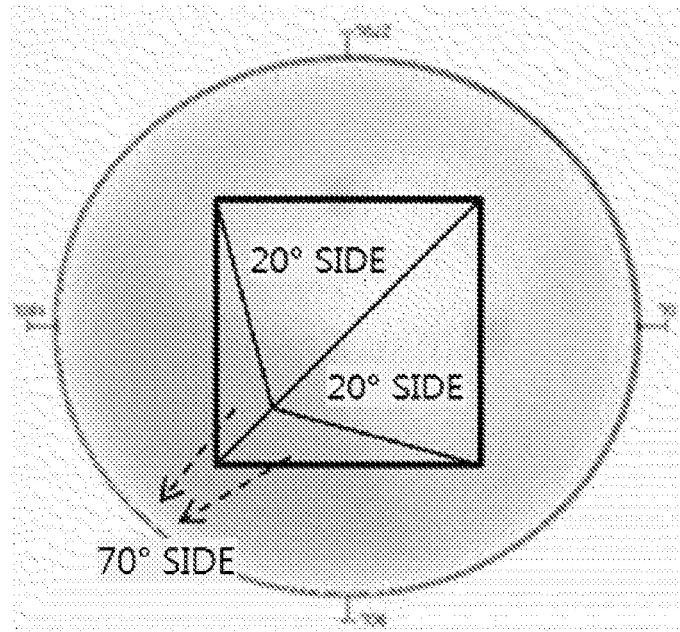
[FIG. 25]
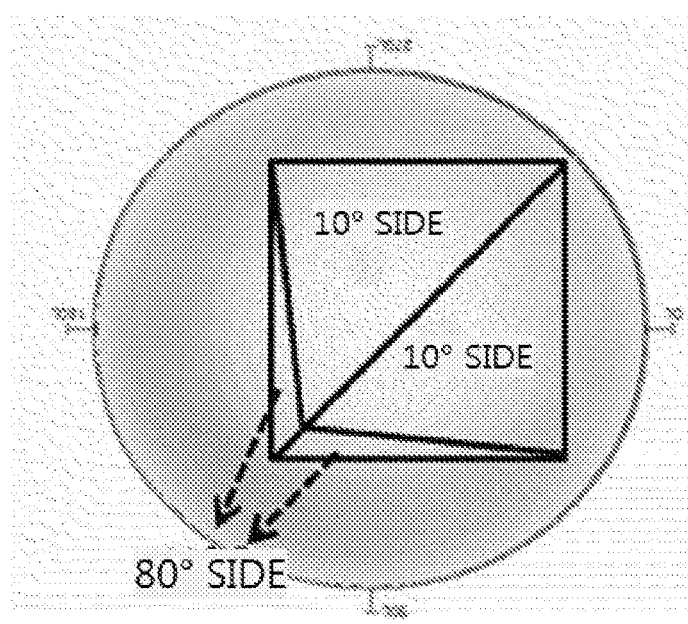

[FIG. 26]
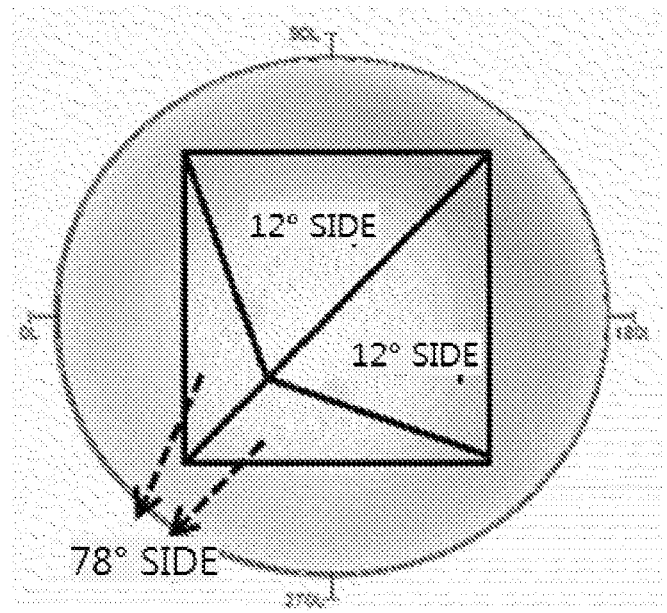
[FIG. 27]
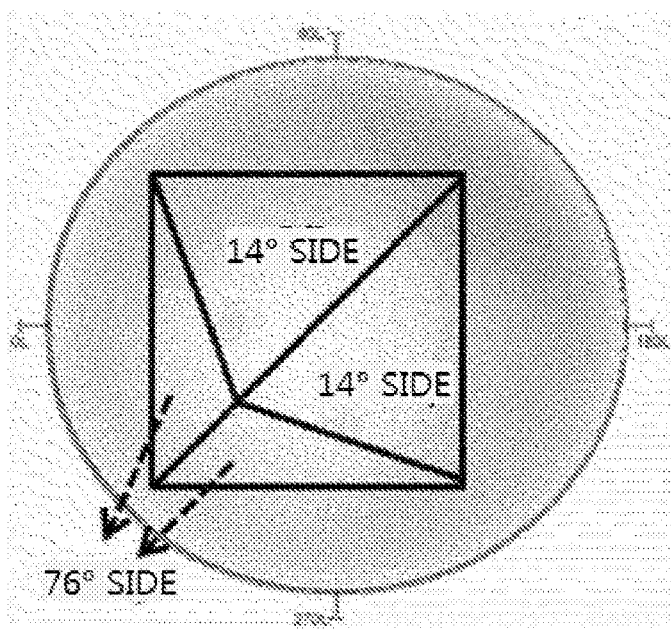

[FIG. 28]
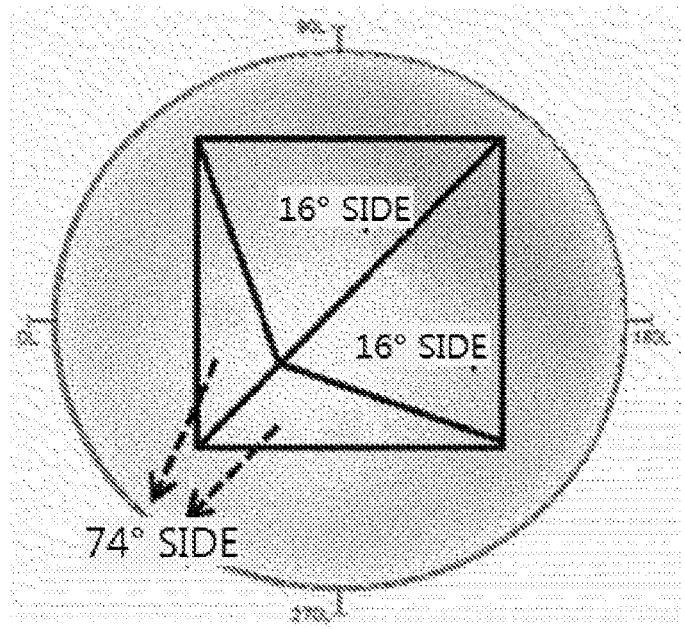
[FIG. 29]
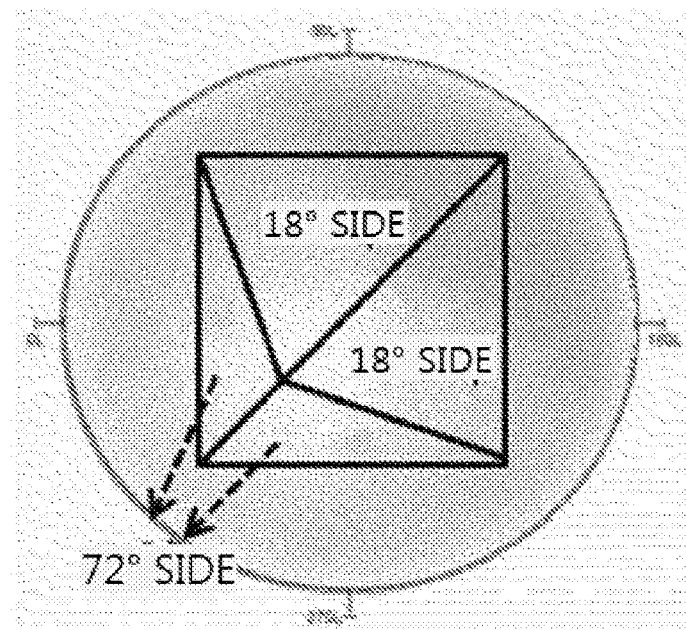

【FIG. 30】
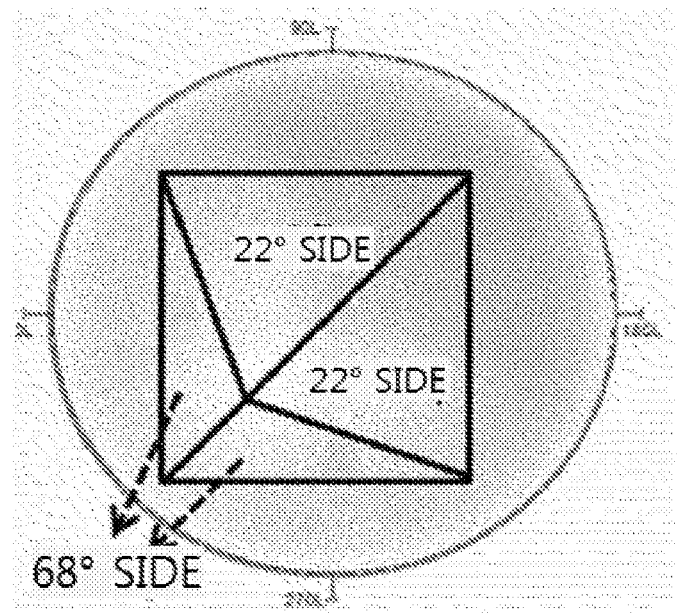
【FIG. 31】
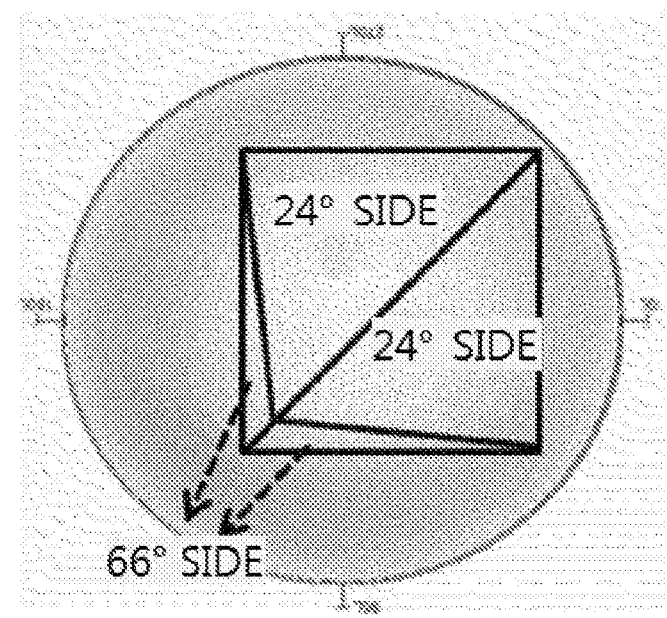

[FIG. 32]
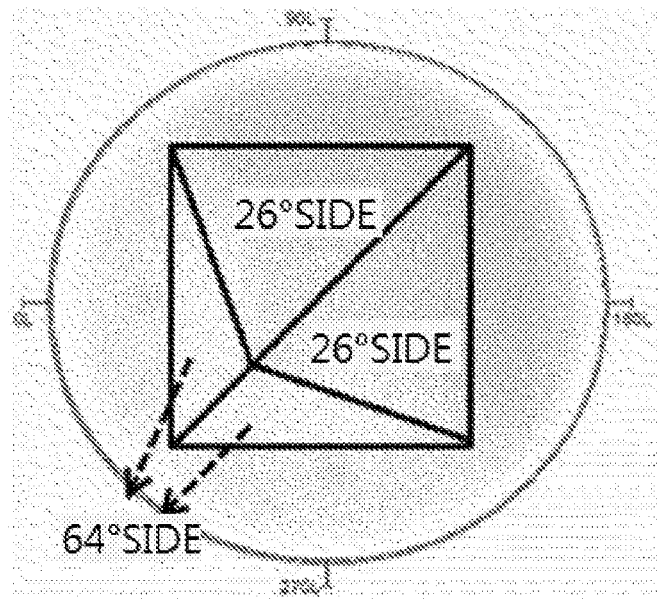
[FIG. 33]
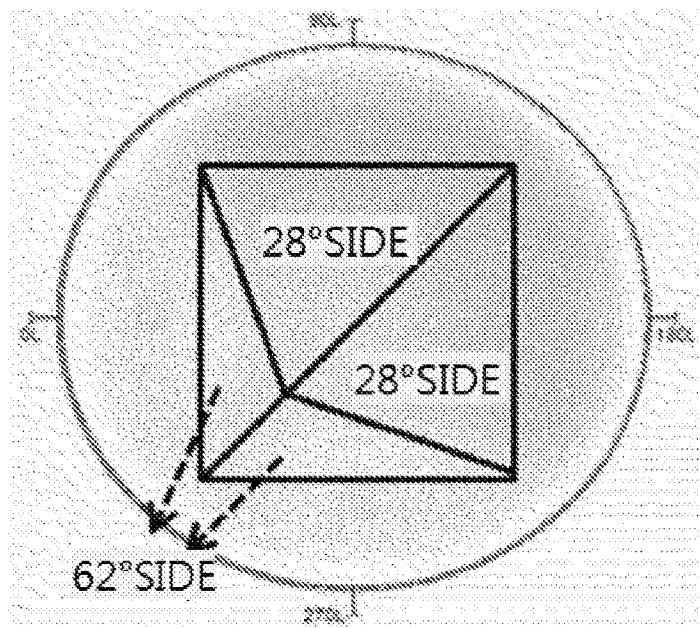

[FIG. 34]
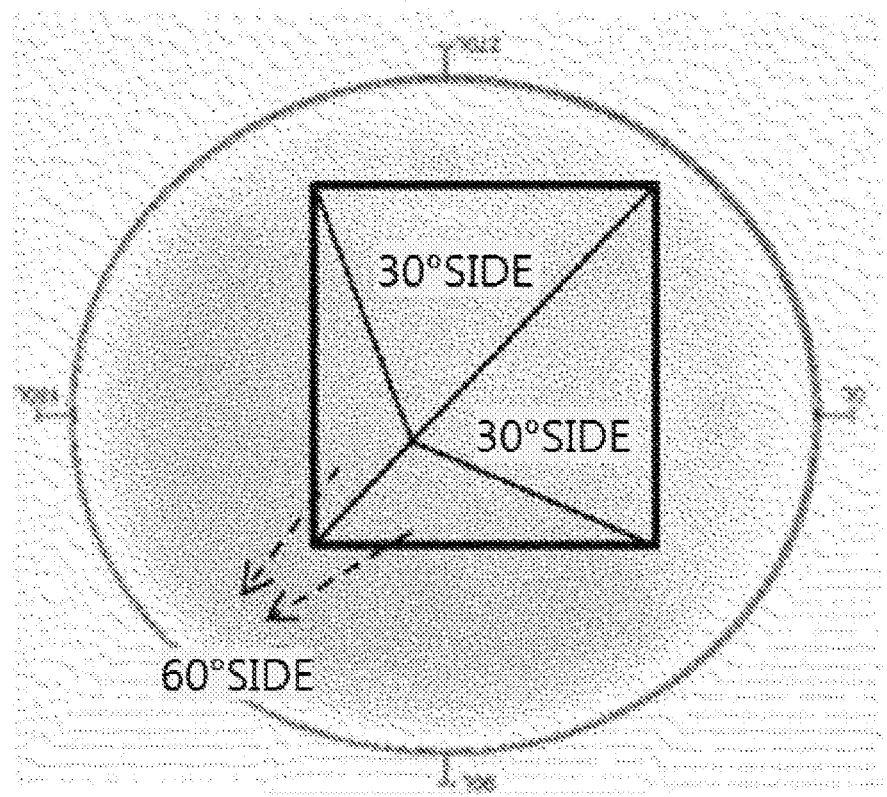

【FIG. 35】
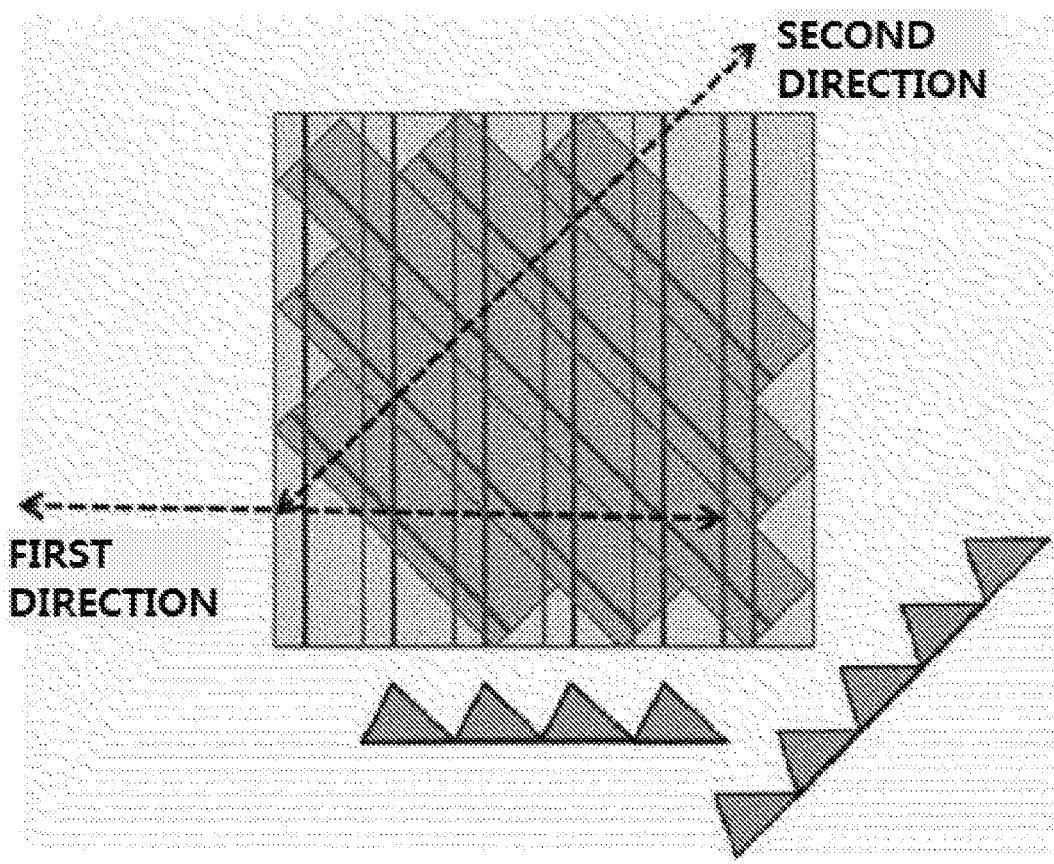

[FIG. 36]
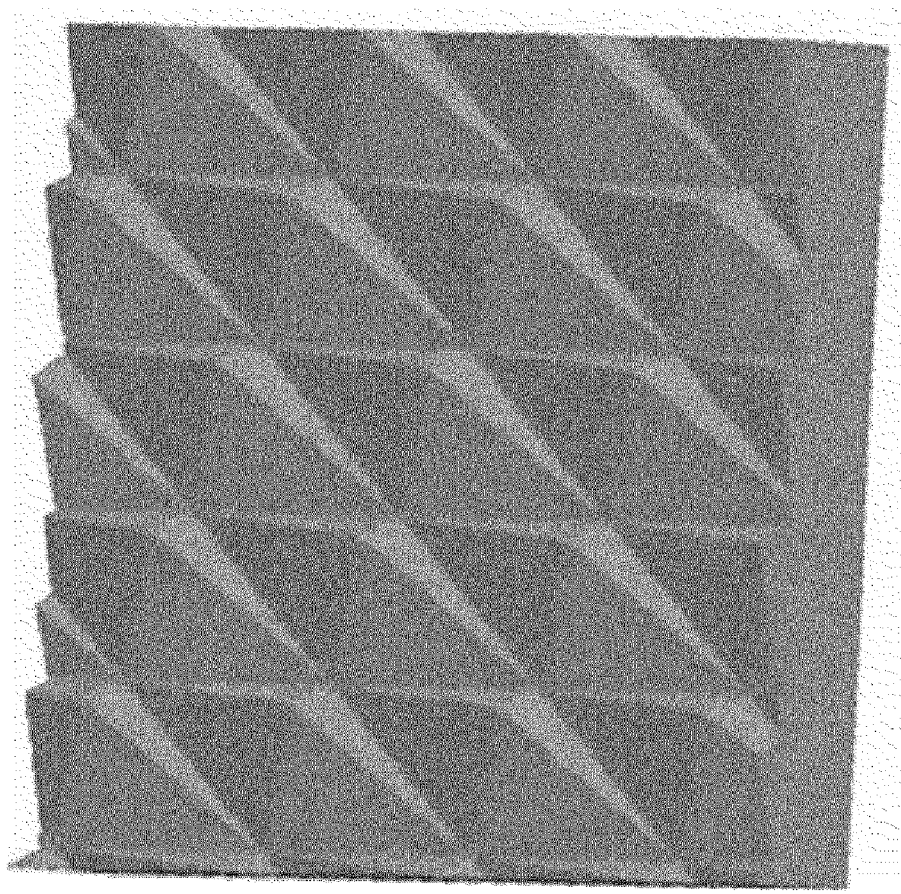

【FIG. 37】
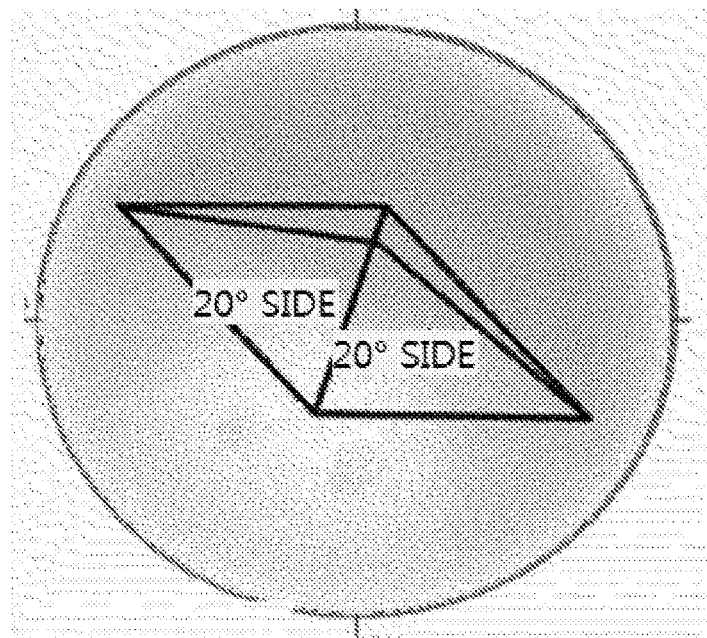
【FIG. 38】
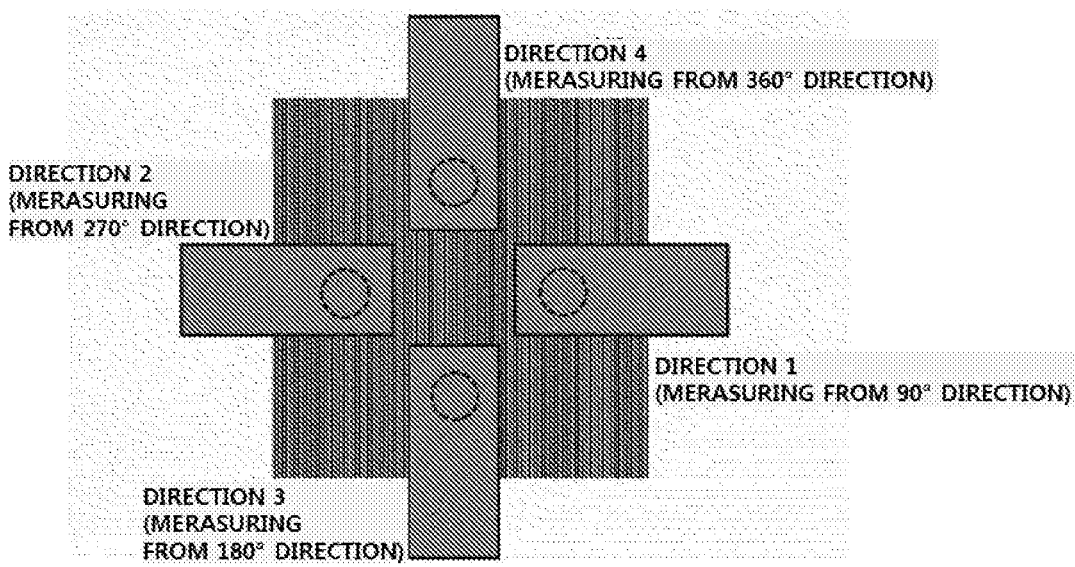

[FIG. 39]
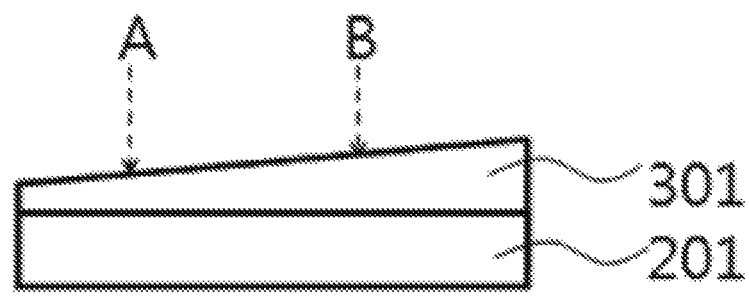
[FIG. 40]
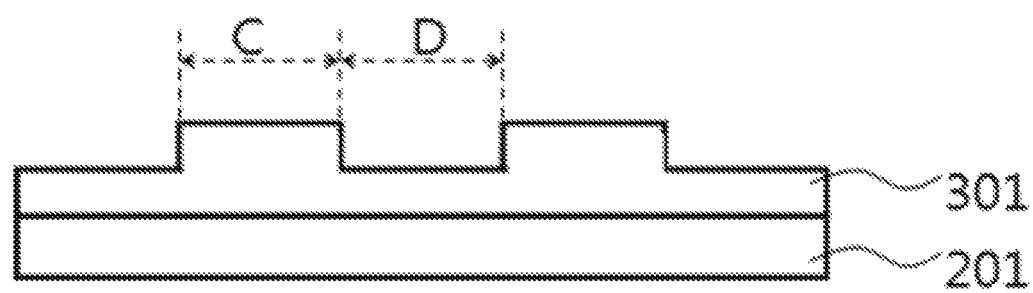
[FIG. 41]
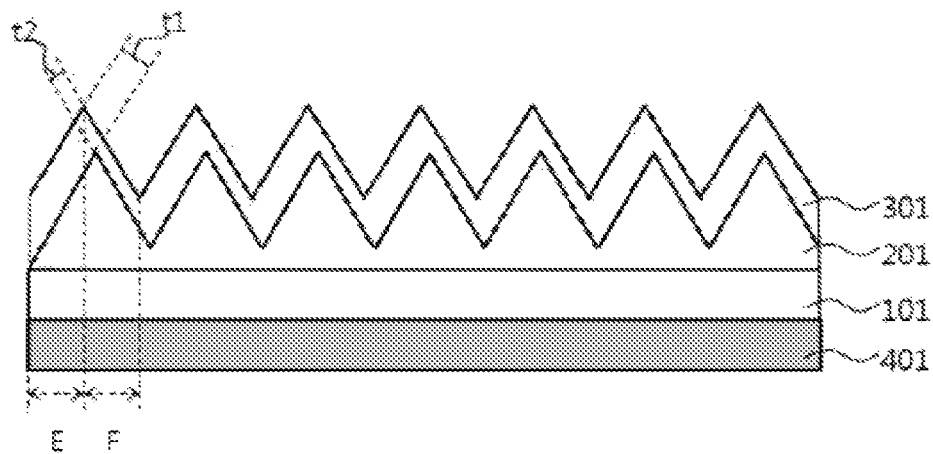

[FIG. 42]
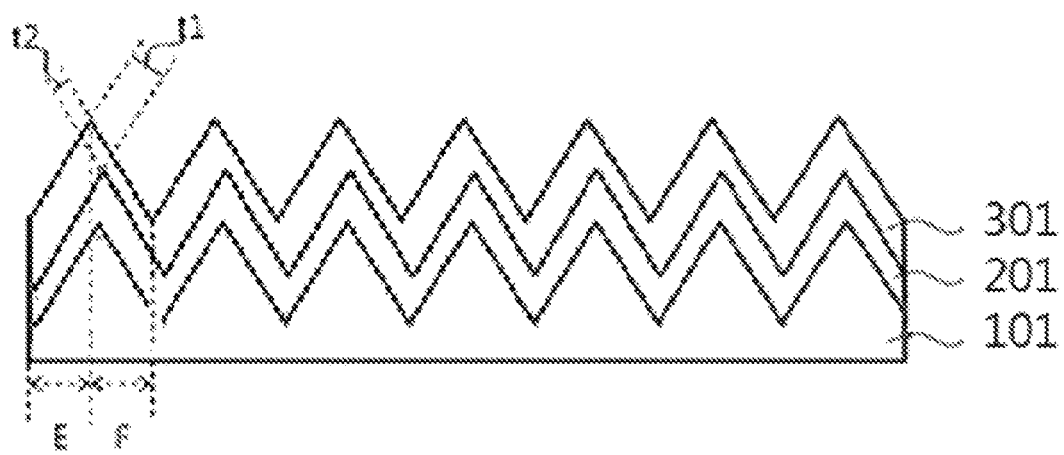
[FIG. 43]
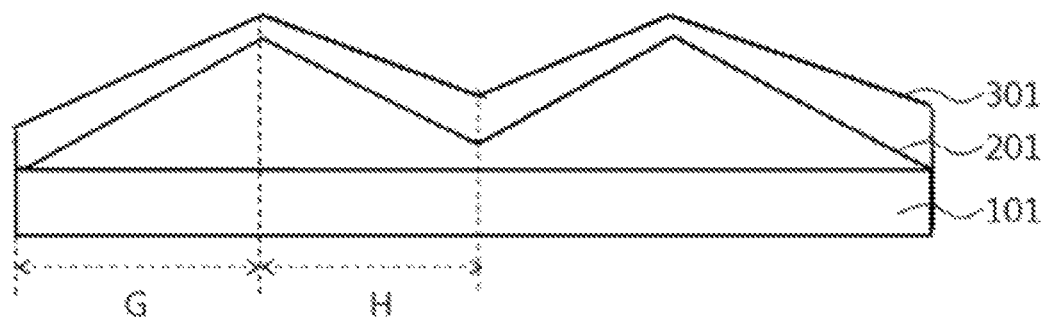

DECORATION MEMBER AND METHOD FOR MANUFACTURING SAME

The present application is a National Phase entry pursuant to 35 U.S.C. § 371 of International Application No. PCT/KR2019/004234 filed Apr. 9, 2019, and claims priority to and the benefits of Korean Patent Application No. 10-2018-0041562, filed with the Korean Intellectual Property Office on Apr. 10, 2018, and Korean Patent Application No. 10-2018-0103927, filed with the Korean Intellectual Property Office on Aug. 31, 2018, the entire contents of which are incorporated herein by reference.

FIELD

The present application relates to a decoration member and a method for preparing the same.

BACKGROUND

For cosmetic containers, various mobile devices and electronic products, product designs such as colors, shapes and patterns play a major role in providing product values to customers in addition to product functions. Product preferences and prices are also dependent on designs.

As for cosmetic compact containers as one example, various colors and color senses are obtained using various methods and used in products. A method of providing colors to a case material itself and a method of providing designs by attaching a deco film implementing colors and shapes to a case material may be included.

In existing deco films, attempts have been made to develop colors through methods such as printing and deposition. When expressing heterogeneous colors on a single surface, printing needs to be conducted two or more times, and implementation is hardly realistic when applying various colors to a three-dimensional pattern. In addition, existing deco films have fixed colors depending on a viewing angle, and even when there is a slight change, the change is limited to just a difference in the color sense.

Patent Document 1: Korean Patent Application Laid-Open Publication No. 10-2010-0135837.

SUMMARY

The present application relates to a decoration member and a method for preparing the same.

One embodiment of the present application provides a decoration member including a substrate; a pattern layer provided on one surface of the substrate and including a convex structure or a concave structure arranged two-dimensionally; and an inorganic material layer provided on the pattern layer, wherein the two-dimensionally-arranged structure is arranged in a first axis direction and a second axis direction forming an angle of greater than or equal to 1 degree and less than or equal to 175 degrees in a clockwise direction with the first axis direction.

Another embodiment of the present specification provides a method for preparing the decoration member described above, the method including preparing a substrate; forming a pattern layer including a convex structure or a concave structure arranged two-dimensionally on one surface of the substrate; and forming an inorganic material layer on the pattern layer, wherein the two-dimensionally-arranged structure is arranged in a first axis direction and a second axis direction forming an angle of greater than or equal to 1 degree and less than or equal to 175 degrees in a clockwise direction with the first axis direction.

A decoration member according to one embodiment of the present specification is capable of exhibiting dichroism in two or more directions by including a pattern layer including a convex structure or a concave structure arranged two-dimensionally.

The present application provides a decoration member having dichroism displaying a different color depending on a viewing direction and capable of controlling the number of directions and the degree that the dichroism is developed, and a method for preparing the decoration member.

BRIEF DESCRIPTION OF THE DRAWINGS

FIG. 1 to FIG. 4 each illustrate a laminated structure of a decoration member according to an embodiment of the present specification.

FIG. 5 illustrates a method of determining a first axis direction and a second axis direction.

FIG. 6 to FIG. 16, FIG. 19 and FIG. 20 each illustrate a decoration member according to an embodiment of the present specification.

FIG. 17 illustrates a method of distinguishing a light absorbing layer and a light reflective layer.

FIG. 18 illustrates a principle of color development obtained by a light absorbing layer and a light reflective layer.

FIG. 21 shows a one-dimensional asymmetric pattern of Comparative Example 1.

FIG. 22 and FIG. 23 show a two-dimensional asymmetric pattern of Example 1.

FIG. 24 to FIG. 34 illustrate changes in brightness of decoration members of Example 1 to Example 11 depending on a viewing direction.

FIG. 35 and FIG. 36 show a two-dimensional asymmetric pattern of Example 12.

FIG. 37 illustrates changes in brightness of a decoration member of Example 12 depending on a viewing direction.

FIG. 38 shows a first direction and a second direction of an example.

FIG. 39 to FIG. 43 each show a shape of a light absorbing layer.

DETAILED DESCRIPTION

Hereinafter, the present specification will be described in detail.

In the present specification, "or" represents, unless defined otherwise, a case of selectively or all including those listed, that is, a meaning of "and/or".

In the present specification, a "layer" means covering 70% or more of an area where the corresponding layer is present. It means covering preferably 75% or more, and more preferably 80% or more.

In the present specification, a "cross-section" means a surface when cutting the convex structure or the concave structure in any one direction. For example, a cross-section may mean, when placing the decoration member on the ground, a surface when cutting the convex structure or the concave structure in a direction parallel to the ground or a direction perpendicular to the ground.

In the present specification, the "two-dimensionally-arranged structure" may mean a "two-dimensionally-arranged convex structure" or a "two-dimensionally-arranged concave structure".

In the present specification, the "convex structure" means a structure having a convex shape compared other neighboring parts, and the shape is not limited unless particularly limited.

In the present specification, the "concave structure" means a structure having a concave shape compared other neighboring parts, and the shape is not limited unless particularly limited.

In the present specification, a "convex portion" means a cross-section in any one direction of the "convex structure", and a "concave portion" means a cross-section in any one direction of the "concave structure".

In the present specification, the "asymmetric-structured cross-section" means a structure in which a figure formed with borders of the cross-section does not have line symmetry or point symmetry. Line symmetry refers to having a property of overlapping when mirroring a certain figure centering on a straight line. Point symmetry refers to, when a certain figure rotates 180 degrees based on one point, having a symmetrical property completely overlapping the original figure. Herein, the borders of the asymmetric-structured cross-section may be a straight line, a curved line or a combination thereof.

As described above, the decoration member may develop dichroism by the convex structure or the concave structure included in a pattern layer. Dichroism means different colors being observed depending on a viewing angle. Colors may be expressed by CIE L*a*b*, and a color difference may be defined using a distance (ΔE*ab) in the L*a*b* space. Specifically, the color difference is $\Delta E^*ab = \sqrt{\{(\Delta L)^2 + (\Delta a)^2 + (\Delta b)^2\}}$, and within a range of 0<ΔE*ab<1, an observer may not recognize the color difference [reference document: Machine Graphics and Vision 20(4):383-411]. Accordingly, dichroism may be defined by ΔE*ab>1 in the present specification.

In the present specification, a "thickness" of a certain layer means a shortest distance from a lower surface to an upper surface of the corresponding layer.

In the present specification, the "direction" of the "first direction" and the "second direction" may mean, in a first inclined side and a second inclined surface that the cross-section of the structure has, a direction from the inclined side having a small inclined angle to the inclined side having a large inclined angle.

FIG. 1 to FIG. 4 each illustrate a laminated structure of a decoration member according to an embodiment of the present specification.

FIG. 1 illustrates a laminated structure of a decoration member in which a substrate (100), a pattern layer (200) and an inorganic material layer (300) are consecutively provided.

FIG. 4 illustrates a laminated structure of a decoration member according to one embodiment of the present specification. FIG. 4 illustrates a laminated structure of a decoration member in which an inorganic material layer (300) includes a light absorbing layer (301) and a light reflective layer (302)

In FIG. 1 to FIG. 4, the reference numeral (400) may mean a protective layer.

One embodiment of the present specification provides a decoration member including a substrate; a pattern layer provided on one surface of the substrate and including a convex structure or a concave structure arranged two-dimensionally; and an inorganic material layer provided on the pattern layer, wherein the two-dimensionally-arranged structure is arranged in a first axis direction and a second axis direction forming an angle of greater than or equal to 1 degree and less than or equal to 175 degrees in a clockwise direction with the first axis direction. By the decoration member having a pattern layer including a convex structure or a concave structure arranged two-dimensionally, dichroism of the decoration member appears in various directions. Meanwhile, by adjusting a direction in which each of the structures is arranged to a specific angle range, an effect of adjusting a dichroism appearing direction to a target range is obtained.

In one embodiment of the present specification, the decoration member includes a pattern layer including a convex structure or a concave structure arranged two-dimensionally. A structure being arranged two-dimensionally means that the direction of the structure being arranged is two directions different from each other. For example, as shown in FIG. 5, a structure being arranged two-dimensionally means, when a line segment connecting a highest point of any convex structure or a lowest point of any concave structure (C0) and a highest point of another convex structure or a lowest point of another concave structure (C1) adjacent to the any convex structure or concave structure is employed as a first axis, and a line segment connecting a highest point of another convex structure or a lowest point of another concave structure (C2) adjacent to the any convex structure or concave structure and not present on the first axis is employed as a second axis, being arranged in two directions of the first axis direction and the second axis direction.

In one embodiment of the present specification, the decoration member includes an inorganic material layer provided on the structure. The inorganic material layer may have a single layer structure, or a multilayer structure having two or more different materials. In addition, since the inorganic material layer is provided on the convex structure of the pattern layer, the shape of the inorganic material layer may be determined by various shapes of the convex portion structure. The inorganic material layer will be described later.

In one embodiment of the present specification, the two-dimensionally-arranged structure is arranged in a first axis direction and a second axis direction forming an angle of greater than or equal to 1 degree and less than or equal to 175 degrees in a clockwise direction with the first axis direction.

In the present specification, the "first axis direction" means a direction of a straight line formed by the first axis, and the "second axis direction" means a direction of a straight line formed by the second axis.

In the present specification, the "first axis direction" and the "second axis direction" may mean any one direction in which two or more identical cross-sections appear among the cross sections of the structure. For example, in FIG. 5, a direction parallel to the first axis, a line segment connecting a highest point (C1) of a convex structure or a concave structure, may be referred to as a first axis direction, and a direction parallel to the second axis may be referred to as a second axis direction.

For example, in reference to FIG. 5, in the convex structure of the pattern layer of the decoration member of FIG. 5, a straight line connecting a highest point (C1) of the convex structure most adjacent from a highest point (C0) of any convex structure is referred to as a first axis. In addition, a line segment connecting a highest point (C2) of another adjacent convex structure of the highest point (C0) of the any convex structure may be referred to as a second axis.

In one embodiment of the present specification, a "highest point" of a convex structure means a most convex portion of a convex structure, and may mean any point of a convex structure closest to the inorganic material layer. When a most convex portion of a convex structure is pointed, this point may be referred to as a highest point. In addition, when there are two or more highest points in the convex structure, specifically, when a highest portion of the convex structure is a plane, the center point of the plane may be referred to as a highest point. For example, when a convex structure has a truncated cone shape, a highest point of the convex structure forms a plane-shaped circle, and the center point of the circle may be referred as a highest point of the convex structure.

In one embodiment of the present specification, the angle formed by the first axis direction and the second axis direction in a clockwise direction may be calculated by, in a virtual plane formed by the first axis and the second axis, measuring an angle formed by the first axis and the second axis in a clockwise direction.

In one embodiment of the present specification, the two-dimensionally-arranged structure may be arranged in a first axis direction and a second axis direction forming an angle of greater than or equal to 30 degrees and less than or equal to 150 degrees in a clockwise direction with the first axis.

In one embodiment of the present specification, the number of the convex structures or the concave structures may be from $1/mm^2$ to $1,000,000/mm^2$, preferably from $1/\mu m^2$ to $500,000/\mu m^2$, and more preferably $1/\mu m^2$ to $250,000/\mu m^2$ with respect to an area of the pattern layer surface. When satisfying the above-mentioned numerical range, the number of the convex structures and the concave structures included in the pattern layer is controlled leading to an effect of further increasing dichroism. Herein, $mm^2$ of the denominator means 1 $mm^2$, a unit area of the pattern layer surface.

The area of the pattern layer surface may be a total area of the pattern layer including the structures, and the number of the structures means the number of the structures in the corresponding area. The number of the structures may be calculated by counting the number of highest points of the convex structures or the number of lowest points of the concave structures.

In one embodiment of the present specification, the decoration member is a decoration member in which any one or more of a cross-section cutting the convex structure or the concave structure in a first plane (Z1); and a cross-section cutting in a second plane (Z2) have an asymmetric structure, wherein the first plane includes a straight line parallel to the first axis direction, the second plane includes a straight line parallel to the second axis direction, and the first plane and the second plane include a straight line passing through a highest point of the convex structure or a lowest point of the concave structure among normal lines on one surface of the substrate.

In this case, a cross-section appearing in any one or more directions of the structure is an asymmetric-structured cross-section, and therefore, the decoration member may have dichroism appearing in a specific direction. For example, when the cross section cutting in a first plane (Z1) is an asymmetric-structured cross-section, the decoration member may have dichroism appearing in the first axis direction, and when the cross-section cutting in a second plane (Z2) is an asymmetric-structured cross-section, the decoration member may have dichroism appearing in the second axis direction.

In addition, as described above, adjusting an angle formed by the first axis direction and the second axis direction has an advantage of controlling a direction of dichroism appearing in the decoration member.

In one embodiment of the present specification, a cross-section cutting the convex structure or the concave structure in a first plane (Z1); and a cross section cutting in a second plane (Z2) are asymmetric-structured cross-sections. This is effective in that the decoration member has dichroism appearing in both direction of the first axis direction and the second axis direction.

In one embodiment of the present specification, the first plane and the second plane may be a virtual plane satisfying the descriptions provided above on each of these.

In one embodiment of the present specification, a cross-section cutting the convex structure or the concave structure in a first plane (Z1); and a cross section cutting in a second plane (Z2) are the same as or different from each other, and each have a convex portion shape or a concave portion shape having an asymmetric-structured cross-section.

In one embodiment of the present specification, a cross-section cutting the convex structure or the concave structure in a first plane (Z1); and a cross section cutting in a second plane (Z2) are the same as or different from each other, and may each be an isosceles triangle. An isosceles triangle means a triangle in which lengths of three sides are all different.

In one embodiment of the present specification, a cross-section cutting the convex structure or the concave structure in a first plane (Z1); and a cross section cutting in a second plane (Z2) may be different from each other. For example, a cross-section cutting the convex structure or the concave structure in a first plane (Z1) may be a triangle in which both inclined angles are each 20 degrees and 70 degrees, and a cross section cutting in a second plane (Z2) may be a triangle in which both inclined angles are 10 degrees and 80 degrees.

In one embodiment of the present specification, a flat portion may be further included between the convex structures or the concave structures. The flat portion may mean a region in which the convex structure or the concave structure is not provided, and descriptions on the convex structure provided above may be applied to the concave structure except that the concave structure has a shape inverting the convex structure described above.

In one embodiment of the present specification, in the convex portion or concave portion shape having an asymmetric-structured cross-section, at least one cross-section includes two or more sides having different inclined angles, different curvatures, or different side shapes. For example, when two sides among the sides forming at least one cross-section have different inclined angles, different curvatures, or different side shapes, the convex portion or the concave portion has an asymmetric structure.

In the present specification, unless mentioned otherwise, the "side" may be a straight line, but is not limited thereto, and a part or all thereof may be a curved line. For example, the side may include a structure of a part of an arc of a circle or oval, a wave structure or a zigzag.

In the present specification, when the side includes a part of an arc of a circle or an oval, the circle or the oval may have a radius of curvature. The radius of curvature may be defined by, when converting an extremely short section of a curved line into an arc, the radius of the arc.

In the present specification, unless mentioned otherwise, the "inclined side" means, when placing the decoration member on the ground, a side having an angle formed by the side with respect to the ground being greater than 0 degrees and less than or equal to 90 degrees. Herein, when the side is a straight line, an angle formed by the straight line and the ground may be measured. When the side includes a curved line, an angle formed by, when placing the decoration member on the ground, the ground and a straight line connecting a point closest to the ground of the side and a point farthest from the ground of the side in a shortest distance may be measured.

In the present specification, unless mentioned otherwise, the "inclined surface" means, when placing the decoration member on the ground, a surface having an angle formed by the surface with respect to the ground being greater than 0 degrees and less than or equal to 90 degrees. Herein, when the surface is a flat surface, an angle formed by the flat surface and the ground may be measured. When the surface includes a curved surface, an angle formed by, when placing the decoration member on the ground, the ground and a straight line connecting a point closest to the ground of the surface and a point farthest from the ground of the surface in a shortest distance may be measured.

In the present specification, unless mentioned otherwise, the inclined angle is an angle formed by, when placing the decoration member on the ground, the ground and a surface or a side forming the pattern layer, and is greater than 0 degrees and less than or equal to 90 degrees. Alternatively, it may mean an angle formed by the ground and a line segment (a'-b') made when connecting a point (a') where a surface or a side forming the pattern layer adjoins the ground and a point (b') where a surface or a side forming the pattern layer is farthest from the ground.

In the present specification, unless mentioned otherwise, the curvature means a degree of changes in the slope of the tangent at continuous points of a side or a surface. As the change in the slope of the tangent at continuous points of a side or a surface is larger, the curvature is high.

In one embodiment of the present specification, the asymmetric-structured cross-section includes a first inclined side and a second inclined side having different inclined angles.

In one embodiment of the present specification, borders of the asymmetric-structured cross-section are a straight line, a curved line or a combination thereof.

In one embodiment of the present specification, the first inclined side and the second inclined side are a straight line, a curved line or a combination thereof.

FIG. 6 presents the first inclined side and the second inclined side having a straight-line shape. Each convex portion shape includes a first region (D1) including a first inclined side and a second region (D2) including a second inclined side. The first inclined side and the second inclined side have a straight-line shape. An angle (c3) formed by the first inclined side and the second inclined side may be from 75 degrees to 105 degrees. An angle (c1) formed by the first inclined side and the ground (substrate) and an angle (c2) formed by the second inclined side and the ground are different. For example, a combination of c1 and c2 may be 20 degrees/80 degrees, 10 degrees/70 degrees or 30 degrees/70 degrees.

FIG. 7 presents the first inclined side or the second inclined side having a curved-line shape. Each convex portion shape includes a first region (E1) including a first inclined side and a second region (E2) including a second inclined side. For example, the first inclined side and the second inclined side may both have a curved-line shape, or the first inclined side may have a straight-line shape, and the second inclined side may have a curved-line shape. When the first inclined side has a straight-line shape and the second inclined side has a curved-line shape, the angle c1 may be larger than the angle c2. FIG. 7 illustrates a case when the first inclined side has a straight-line shape and the second inclined side has a curved-line shape. An angle formed by the inclined side having a curved-line shape with the ground may be calculated from, when drawing an arbitrary straight line from a point where the inclined side touching the ground to a point where the first inclined side and the second inclined side adjoin, an angle formed by the straight line and the ground. The curved-line-shaped second inclined side may have a different curvature depending on the pattern layer height, and the curved line may have a radius of curvature. The radius of curvature may be 10 times or less than the pitch (E1+E2) of the convex portion shape. FIG. 7(a) shows a radius of curvature of the curved line being twice the pitch of the convex portion shape, and FIG. 7(b) shows a radius of curvature of the curved line being the same as the pitch of the convex portion shape. A ratio of the part (E2) having a curvature with respect to the pitch (E1+E2) of the convex portion may be 90% or less. FIG. 7(a) and FIG. 7(b) illustrate a ratio of the part (E2) having a curvature with respect to the pitch (E1+E2) of the convex portion being 60%.

In one embodiment of the present specification, the asymmetric-structured cross-section may have a polygonal shape such as a triangle or a quadrangle.

In one embodiment of the present specification, the convex portion shape (P1) may be a triangle or a shape further including a small concave portion (P3) on a tip portion (pointed part or vertex part) of the triangle. FIG. 8 illustrates the convex portion shape (P1) including a concave portion (P3). A shape further including a concave portion (P3) having a smaller height compared to the convex portion on a tip portion (pointed part) of the convex portion shape may be included. Such a decoration member may exhibit an effect of an image color softly changing depending on a viewing angle.

FIG. 9 presents the convex portion shape being a quadrangle shape. The quadrangle shape may be a general quadrangle shape, and is not particularly limited as long as an inclined angle of each inclined side is different. The quadrangle shape may be a shape left after partially cutting a triangle. For example, a trapezoid that is a quadrangle in which one pair of opposite sides is parallel, or a quadrangle shape in which a pair of opposite sides parallel to each other is not present may be included. The convex portion shape includes a first region (F1) including a first inclined side, a second region (F2) including a second inclined side and a third region (F3) including a third inclined side. The third inclined side may or may not be parallel to the ground. For example, when the quadrangle shape is a trapezoid, the third inclined side is parallel to the ground. Any one or more of the first inclined side to the third inclined side may have a curved-line shape, and descriptions on the curved-line shape are the same as described in the 5$^{th}$ example. The combined length of F1+F2+F3 may be defined as a pitch of the convex portion shape, and descriptions on the pitch are the same as the descriptions provided above.

FIG. 10 presents a method of determining the convex portion shape. The convex portion shape may have a shape removing a specific region of the ABO1 triangle shape. A method of determining the removed specific region is as follows. Details on the inclined angles c1 and c2 are the same as the descriptions provided above.

1) An arbitrary point P1 on an A01 line segment dividing the A01 line segment in a ratio of L1:L2 is set.
2) An arbitrary point P2 on a B01 line segment dividing the B01 line segment in a ratio of m1:m2 is set.
3) An arbitrary point O2 on an AB line segment dividing the AB line segment in a ratio of n1:n2 is set.
4) An arbitrary point P3 on an 0102 line segment dividing the 0201 line segment in a ratio of o1:o2 is set.

Herein, the ratios of L1:L2, m1:m2, n1:n2 and o1:o2 are the same as or different from each other, and may be each independently from 1:1000 to 1000:1.

5) The region formed by the P1O1P2P3 polygon is removed.
6) The shape formed by the ABP2P3P1 polygon is employed as the cross-section of the convex portion.

The convex portion shape may be modified to various shapes by adjusting the ratios of L1:L2, m1:m2, n1:n2 and o1:o2. For example, the height of the pattern may increase when L1 and m1 increase, and the height of the concave portion formed on the convex portion may decrease when o1 increases, and by adjusting the ratio of n1, the position of a lowest point of the concave portion formed on the convex portion may be adjusted to be closer to any one side of the inclined sides of the convex portion.

When the ratios of L1:L2, m1:m2 and o1:o2 are all the same, the cross-section shape may be a trapezoidal shape (FIGS. 11(a)-11(b)). The height of the trapezoid (ha, hb) may vary by adjusting the ratio of L1:L2. For example, FIG. 11(a) illustrates a convex portion shape prepared when the L1:L2 ratio is 1:1, and FIG. 11(b) illustrates a convex portion shape prepared when the L1:L2 ratio is 2:1.

In one embodiment of the present specification, an angle formed by the first inclined side and the second inclined side may be in a range of 80 degrees to 100 degrees. Specifically, the angle may be 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined side and the second inclined side. When the first inclined side and the second inclined side do not form a vertex with each other, the angle may mean an angle of a vertex in a state forming a vertex by virtually extending the first inclined side and the second inclined side.

In one embodiment of the present specification, an inclined angle difference between the first inclined side and the second inclined side may be in a range of 30 degrees to 70 degrees. A difference between the inclined angle of the first inclined side (a2) and the inclined angle of the second inclined side (a3) may be, for example, 30 degrees or greater, degrees or greater, 40 degrees or greater or 45 degrees or greater, and may be 70 degrees or less, 65 degrees or less, 60 degrees or less or 55 degrees or less. Having an inclined angle difference between the first inclined side and the second inclined side in the above-mentioned range may be advantageous in terms of obtaining direction-dependent color expression.

In one embodiment of the present specification, a cross-section cutting the convex structure or the concave structure in a plane including the first axis and the second axis (Z3) may have a shape of square, rectangle or polygon. For example, when an angle formed by the first axis and the second axis is 90 degrees, and a distance (d1) between highest points of the convex structures arranged in the first axis direction and a distance (d2) between highest points of the convex structures arranged in the second axis direction are the same, the cross-section as a plane formed by the first axis and the second axis of the convex structure may be square.

In one embodiment of the present specification, two or more of the convex structures having a different height in any one direction of the first direction and the second direction may be included. FIG. 12 presents a shape in which a cross-section cutting the convex structure or the concave structure in a first plane (Z1); or a cross-section cutting in a second plane (Z2) is each arranged.

FIG. 12 presents a shape in which, in a cross-section cutting the convex structure or the concave structure in a first plane (Z1); and a cross-section cutting in a second plane (Z2), a second convex portion shape having a smaller height than the convex portion shape is arranged between the convex portion shapes (P1). This may be a shape in which a second convex structure having a small height than the convex structure is arranged between the convex structures.

Hereinafter, the convex structure stated before the second convex structure may be referred to as a first convex structure, and the convex portion stated before the second convex portion shape may be referred to as a first convex portion shape.

In one embodiment of the present specification, a height (H2) of the second convex portion shape (P2) may be in a range of ⅕ to ¼ of the height (H1) of the first convex portion shape (P1). For example, a height difference (H1-H2) between the first convex portion shape and the second convex portion shape may be from 10 μm to 30 μm. A width (W2) of the second convex portion shape may be from 1 μm to 10 μm. The width (W2) of the second convex portion shape may specifically be 1 μm or greater, 2 μm or greater, 3 μm or greater, 4 μm or greater or 4.5 μm or greater, and may be 10 μm or less, 9 μm or less, 8 μm or less, 7 μm or less, 6 μm or less or 5.5 μm or less.

In one embodiment of the present specification, the second convex portion shape may have two inclined surfaces (S3, S4) having different inclined angles. An angle (a4) formed by the two inclined surfaces of the second convex portion shape may be from 20 degrees to 100 degrees. Specifically, the angle (a4) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a6–a5) between both inclined surfaces of the second convex portion may be from 0 degrees to 60 degrees. The inclined angle difference (a6–a5) may be 0 degrees or greater, 10 degrees or greater, 20 degrees or greater, 30 degrees or greater, 40 degrees or greater or 45 degrees or greater, and may be 60 degrees or less or 55 degrees or less. The second convex portion shape having a dimension in the above-mentioned range may be advantageous in terms of forming bright color by increasing light inflow from a side surface having a large inclined surface angle.

In the present specification, inclined angles (a2, a3) of the convex portion shape (P1) may mean angles formed between inclined surfaces (S1, S2) of the convex portion shape (P1) and a horizontal surface of the pattern layer. Unless particularly mentioned otherwise in the present specification, the first inclined surface may be defined as a left inclined surface of the convex portion shape, and the second inclined surface may mean a right inclined surface of the convex portion shape in the drawings.

In one embodiment of the present specification, the convex portion shape (P1) has a polygonal cross-section, and may have a column shape extending in one direction.

In one embodiment of the present specification, a height (H3) of the concave portion (P3) may be from 3 μm to 15 μm. Specifically, a height (H3) of the concave portion (P3) may be 3 μm or greater, and may be 15 μm or less, 10 μm or less or 5 μm or less. The concave portion may have two inclined surfaces (S5, S6) having different inclined angles. An angle (a7) formed by the two inclined surfaces of the concave portion may be from 20 degrees to 100 degrees.

Specifically, the angle (a7) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a9−a8) between both inclined surfaces of the concave portion may be from 0 degrees to 60 degrees. The inclined angle difference (a9−a8) may be 0 degrees or greater, 10 degrees or greater, 20 degrees or greater, 30 degrees or greater, 40 degrees or greater or 45 degrees or greater, and may be 60 degrees or less or 55 degrees or less. The concave portion having a dimension in the above-mentioned range may be advantageous in terms of adding a color sense on the inclined surface.

In one embodiment of the present specification, the convex structure may be arranged in an inverted phase structure in any one direction of the first direction and the second direction. FIGS. 13(a)-13(b) illustrate such an arrangement structure. As shown in FIG. 13(a), the structure is arranged in an inverted phase structure of 180 degrees in any one direction of the first direction and the second direction. Specifically, the arrangement in an inverted phase structure may include a first region (C1) in which the second inclined surface has a larger inclined angle compared to the first inclined surface, and a second region (C2) in which the first inclined surface has a larger inclined angle compared to the second inclined surface. In addition, the convex portion included in the first region may be referred to as a first convex portion (P1), and the convex portion included in the second region may be referred to as a fourth convex portion (P4). As for heights, widths, inclined angles and an angle formed by the first and the second inclined surfaces of the first convex portion (P1) and the fourth convex portion (P4), descriptions provided in the convex portion (P1) may be used in the same manner. In addition, as shown in FIG. 13(b), it may be constituted such that any one region of the first region and the second region corresponds to an image or a logo, and the other region corresponds to a background part. Such a decoration member may exhibit an effect of an image or logo color softly changing depending on a viewing angle. In addition, a decorative effect of colors of an image or logo part and a background part looking switched depending on a viewing direction may be obtained.

In one embodiment of the present specification, the convex portion shape (P1) may have a height (H1) of 5 μm to 30 μm.

In one embodiment of the present specification, the convex structure may have a height (H1) of 5 μm to 30 μm. Having the convex structure height in the above-mentioned range may be advantageous in a production process aspect. In the present specification, the convex structure height may mean a shortest distance between a highest part and a lowest part of the convex portion based on the horizontal surface of the pattern layer. As for descriptions relating to the height of the convex portion, the same numerical range may also be used in the depth of the concave portion described above.

In one embodiment of the present specification, the convex portion shape (P1) may have a width (W1) of 10 μm to 90 μm. Having the convex portion shape width in the above-mentioned range may be advantages in a process aspect in processing and forming a pattern. The width (W1) of the convex portion shape (P1) may be, for example, 10 μm or greater, 15 μm or greater, 20 μm or greater or 25 μm or greater, and may be 90 μm or less, 80 μm or less, 70 μm or less, 60 μm or less, 50 μm or less, 40 μm or less or 35 μm or less. The descriptions relating to the width may be used in the concave portion described above as well as the convex portion.

In one embodiment of the present specification, a flat portion is further included between the convex structures or the concave structures arranged two-dimensionally.

In one embodiment of the present specification, a flat portion is further included between the convex portion shapes or the concave portion shapes.

In one embodiment of the present specification, the flat portion may have a width of 0 μm to 20 μm. The flat portion may be a distance between any one convex structure or concave structure and an adjacent convex structure or concave structure. This may mean a shortest distance between a point where any one convex structure or concave structure ends and a point where another convex structure or concave structure starts.

When properly maintaining the width of the flat portion, a phenomenon of a reflection area looking dark due to shading when a relatively bright color is to be obtained when looking at the decoration member from an inclined surface side of the convex portion having a larger inclined angle may be improved.

In one embodiment of the present specification, the convex structure or the concave structure may be a cone-shaped convex structure protruding out of the surface of the pattern layer or a cone-shaped concave structure sunk into the surface of the pattern layer.

In one embodiment of the present specification, the cone shape includes a shape of a circular cone, an oval cone or a polypyramid. Herein, the shape of the bottom surface of the polypyramid includes a triangle, a quadrangle, a star shape having 5 or more protruding points, and the like. According to one embodiment, when the pattern layer surface has a cone-shaped convex portion shape when placing the decoration member on the ground, at least one of cross-sections vertical with respect to the ground of the convex portion shape may have a triangle shape. According to another embodiment, when the pattern layer surface has a cone-shaped concave portion shape when placing the decoration member on the ground, at least one of the cross-sections vertical with respect to the ground of the convex portion shape may have an inverted triangle shape.

In one embodiment of the present specification, the cone-shaped convex portion or the cone-shaped concave structure may have at least one asymmetric-structured cross-section. For example, when observing the cone-shaped convex portion or concave portion from a surface side of the convex portion or concave portion shape, having two or less identical shapes when rotating 360 degrees based on the vertex of the cone is advantageous in developing dichroism. FIG. 14 shows the cone-shaped convex portion shape observed from the surface side of the convex portion shape, and illustrates a symmetric-structured cone shape as well as an asymmetric-structured cone shape.

When placing the decoration member on the ground, the symmetric-structured cone shape has a structure in which a cross-section in a direction parallel to the ground (hereinafter, referred to as a horizontal cross-section) is a circle or a regular polygon having the same side length, and the vertex of the cone is present on the vertical line with respect to the cross-section of the center of gravity of the horizontal cross-section with respect to the ground. However, the cone shape having an asymmetric-structured cross-section has a structure in which, when observing from a surface side of the cone-shaped convex structure or concave structure, the position of the vertex of the cone is present on a vertical line of a point that is not the center of gravity of the horizontal cross-section of the cone, or has a structure in which the horizontal cross-section of the cone is an asymmetric-structured polygon or oval. When the horizontal cross-section of the cone is an asymmetric-structured polygon, at least one of the sides and the angles of the polygon may be designed to be different from the rest.

For example, as in FIG. 15, the position of the vertex of the cone may be changed. Specifically, when designing the vertex of the cone to be located on a vertical line of the center of gravity (O1) of the horizontal cross-section with respect to the ground of the cone when observing from a surface side of the cone-shaped convex structure as in the first drawing of FIG. 15, 4 identical structures may be obtained when rotating 360 degrees based on the vertex of the cone (4-fold symmetry). However, the symmetric structure is broken by designing the vertex of the cone on a position (O2) that is not the center of gravity (O1) of the horizontal cross-section with respect to the ground. When employing a length of one side of the horizontal cross-section with respect to the ground as x, migration distances of the vertex of the cone as a and b, a height of the cone shape, a length of a line vertically connecting from the vertex of the cone (O1 or O2) to the cross-section horizontal with respect to the ground, as h, and an angle formed by the horizontal cross-section and a side surface of the cone as θn, cosine values for Surface 1, Surface 2, Surface 3 and Surface 4 of FIG. 15 may be obtained as follows.

$$\cos(\Theta 1) = \frac{\left(\frac{x}{2}\right)}{\mathrm{sqrt}\left(h^2 + \left(\frac{x}{2}\right)^2\right)}$$

$$\cos(\Theta 2) = \frac{\left(\frac{x}{2}\right)}{\mathrm{sqrt}\left(h^2 + \left(\frac{x}{2}\right)^2\right)}$$

$$\cos(\Theta 3) = \frac{\left(\frac{x}{2} - a\right)}{\mathrm{sqrt}\left(h^2 + \left(\frac{x}{2} - a\right)^2\right)}$$

$$\cos(\theta 4) = \frac{\left(\frac{x}{2} - b\right)}{\mathrm{sqrt}\left(h^2 + \left(\frac{x}{2} - b\right)^2\right)}$$

Herein, θ1 and θ2 are the same, and therefore, there is no dichroism. However, θ3 and θ4 are different, and |θ3-θ4| means a color difference (ΔE*ab) between two colors, and therefore, dichroism may be obtained. Herein, |θ3-θ4|>0. As above, how much the symmetric structure is broken, that is, a degree of asymmetry, may be represented quantitatively using an angle formed by the horizontal cross-section with respect to the ground and a side surface of the cone, and the value representing such a degree of asymmetry is proportional to a color difference of dichroism.

In addition to the structure illustrated above, a convex structure or a concave structure having a cross-section with various convex portion shapes or concave portion shapes as in FIG. 16 may be obtained.

In the present specification, unless mentioned otherwise, the "surface" may be a flat surface, but is not limited thereto, and a part or all thereof may be a curved surface. For example, the shape of a cross-section in a direction perpendicular to the surface may include a structure of a part of an arc of a circle or oval, a wave structure or a zigzag.

In one embodiment of the present specification, the pattern layer further includes a symmetric-structured pattern. As the symmetric structure, a prism structure, a lenticular lens structure and the like are included.

In one embodiment of the present specification, the pattern layer has a flat portion on a surface opposite to the surface on which the convex structure or the concave structure is formed. In addition, the flat portion may be formed on a substrate layer. As the substrate layer, a plastic substrate may be used. As the plastic substrate, triacetyl cellulose (TAC); a cycloolefin copolymer (COP) such as a norbornene derivative; poly(methyl methacrylate (PMMA); polycarbonate (PC); polyethylene (PE); polypropylene (PP); polyvinyl alcohol (PVA); diacetyl cellulose (DAC); polyacrylate (Pac); polyether sulfone (PES); polyetherether ketone (PEEK); polyphenyl sulfone (PPS), polyetherimide (PEI); polyethylene naphthalate (PEN); polyethylene terephthalate (PET); polyimide (PI); polysulfone (PSF); polyarylate (PAR), an amorphous fluorine resin or the like may be used, however, the plastic substrate is not limited thereto.

In one embodiment of the present specification, the pattern layer may include a thermo-curable resin or an ultraviolet-curable resin. As the curable resin, a photo-curable resin or a thermo-curable resin may be used. As the photo-curable resin, an ultraviolet-curable resin may be used. Examples of the thermo-curable resin may include a silicone resin, a silicon resin, a furan resin, a polyurethane resin, an epoxy resin, an amino resin, a phenol resin, a urea resin, a polyester resin, a melamine resin or the like, but are not limited thereto. As the ultraviolet-curable resin, an acrylic polymer, for example, a polyester acrylate polymer, a polystyrene acrylate polymer, an epoxy acrylate polymer, a polyurethane acrylate polymer or a polybutadiene acrylate polymer, a silicone acrylate polymer, an alkyl acrylate polymer or the like may be typically used, however, the ultraviolet-curable resin is not limited thereto.

In one embodiment of the present specification, a color dye may be further included inside or at least one surface of the pattern layer. Including a color dye on at least one surface of the pattern layer may mean a case of, for example, including a color dye on the above-described substrate layer provided on the flat portion side of the pattern layer.

In one embodiment of the present specification, as the color dye, an anthraquinone-based dye, a phthalocyanine-based dye, a thioindigo-based dye, a perinone-based dye, an isoxindigo-based dye, a methane-based dye, a monoazo-based dye, a 1:2 metal complex-based dye and the like may be used.

In one embodiment of the present specification, when including the color dye inside the pattern layer, the dye may be added to the curable resin. When further including the color dye at the bottom of the pattern layer, a method of coating the dye-including layer on the top or the bottom of the substrate layer may be used.

In one embodiment of the present specification, the color dye content may be, for example, from 0 wt % to 50 wt %. The color dye content may determine transmittance and haze ranges of the pattern layer or the decoration member, and the transmittance may be, for example, from 20% to 90%, and the haze may be, for example, from 1% to 40%.

In the present specification, the inorganic material layer may have the same convex portion or concave portion as the surface of the convex structure or concave structure of the pattern layer described above.

In one embodiment of the present specification, the inorganic material layer may have the same slope as the surface of the pattern layer described above.

The inorganic material layer may have the same convex structure or concave structure as the surface of the pattern layer described above. The inorganic material layer may have the same slope as the surface of the pattern layer described above.

In one embodiment of the present specification, the inorganic material layer may be a single layer or a multilayer including one, two or more types of materials among one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), oxides thereof; nitrides thereof; oxynitrides thereof; carbon and carbon composites.

In one embodiment of the present specification, the inorganic material layer may have a refractive index of 0 to 8 for light having a wavelength of 400 nm. When the inorganic material layer has a refractive index outside the above-mentioned range, it becomes dark by reflected light being diminished, which may not be suitable. The inorganic material layer may specifically have a refractive index of 0 or greater, 1 or greater, 2 or greater, 3 or greater, 4 or greater or 4.5 or greater, and 8 or less, 7 or less, 6 or less or 6.5 or less.

In one embodiment of the present specification, the inorganic material layer may have a thickness of, for example, nm to 1 μm. When the inorganic material layer has a thickness in the above-mentioned range, dichroism displaying different colors depending on a viewing direction is obtained, which may be advantageous in providing a decoration member having improved dichroic visibility. The inorganic material layer may have a thickness of, for example, 10 nm or greater, 50 nm or greater or 100 nm or greater, and 1 μm or less, 800 nm or less, 600 nm or less, 400 nm or less or 300 nm or less. The decoration member may have dichroism displaying different colors depending on a viewing direction. The decoration member may improve dichroic visibility by modifying the shape of the pattern layer surface.

In one embodiment of the present specification, the inorganic material layer may provide metallic texture and depth of colors when looking at the decoration member. The inorganic material layer allows an image of the decoration member to be seen in various colors depending on a viewing angle. This is due to the fact that a wavelength of light passing through the pattern layer and reflected on the surface of the inorganic material layer changes depending on a wavelength of incident light.

In one embodiment of the present specification, the inorganic material layer includes a light absorbing layer and a light reflective layer consecutively laminated on the pattern layer, or includes a light reflective layer and a light absorbing layer consecutively provided on the pattern layer.

In the present specification, the light absorbing layer and the light reflective layer are named by their functions. For light having a specific wavelength, a layer reflecting light relatively more may be expressed as the light reflective layer, and a layer reflecting light relatively less may be expressed as the light absorbing layer.

Through reference to FIG. 17, the light absorbing layer and the light reflective layer are described. In the decoration member of FIG. 17, each layer is laminated in order of a $L_{i-1}$ layer, a $L_i$ layer and a $L_{i+1}$ layer based on a light entering direction, an interface $I_i$ is located between the $L_{i-1}$ layer and the $L_i$ layer, and an interface $I_{i+1}$ is located between the $L_i$ layer and the $L_{i+1}$ layer.

When irradiating light having a specific wavelength in a direction perpendicular to each layer so that thin film interference does not occur, reflectance at the interface $I_i$ may be expressed by the following Mathematical Equation 1.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2}$$ [Mathematical Equation 1]

In Mathematical Equation 1, $n_i(\lambda)$ means a refractive index depending on the wavelength ($\lambda$) of the $i^{th}$ layer, and $k_i(\lambda)$ means an extinction coefficient depending on the wavelength ($\lambda$) of the $i^{th}$ layer. The extinction coefficient is a measure capable of defining how strongly a subject material absorbs light at a specific wavelength, and the definition is the same as the definition provided above.

Using Mathematical Equation 1, when a sum of reflectance for each wavelength at the interface $I_i$ calculated at each wavelength is $R_i$, $R_i$ is as in the following Mathematical Equation 2.

$$R_i = \frac{\sum_{\lambda=380\,nm}^{\lambda=780\,nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380\,nm}^{\lambda=780\,nm} \Delta\lambda}$$ [Mathematical Equation 2]

Herein, when $R_i$ of Ii is the largest among laminate interfaces, a layer in contact with the interface Ii and located facing the interface Ii in a light-entering direction may be defined as the light reflective layer, and the remaining layers may be defined as the light absorbing layer. For example, in the laminate illustrated in FIG. 17, when a sum of reflectance for each wavelength of the $I_{i+1}$ is the largest, the $L_{i+1}$ layer in contact with $I_{i+1}$, and located facing the interface $I_{i+1}$ in a light-entering direction may be defined as the light reflective layer, and the remaining $L_{i-1}$ layer and $L_i$ layer may be defined as the light absorbing layer.

In the light absorbing layer, light absorption occurs in an entering path and a reflection path of light, and by the light reflecting on each of a surface of the light absorbing layer and an interface of the light absorbing layer and the light reflective layer, the two reflected lights go through constructive or destructive interference. In the present specification, the light reflected on the surface of the light absorbing layer may be expressed as surface reflected light, and the light reflected on the interface of the light absorbing layer and the light reflective layer may be expressed as interface reflected light. A mimetic diagram of such a working principle is illustrated in FIG. 18. FIG. 18 illustrates a structure in which a substrate (101), a light reflective layer (201) and a light absorbing layer (301) are consecutively laminated, and although the substrate is located at the bottom of the light reflective layer, the structure is not limited thereto.

The light reflected on a surface of the light absorbing layer may be expressed as surface reflected light, and the light reflected on an interface of the light absorbing layer and the light reflective layer may be expressed as interface reflected light.

In one embodiment of the present specification, the light absorbing layer preferably has a refractive index (n) of 0 to 8 at a wavelength of 400 nm, and the refractive index may be from 0 to 7, may be from 0.01 to 3, and may be from 2 to 2.5. The refractive index (n) may be calculated by sin θa/sin θb (θa is an angle of light entering a surface of the light absorbing layer, and θb is a refraction angle of light inside the light absorbing layer).

In one embodiment of the present specification, the light absorbing layer may have an extinction coefficient (k) of greater than 0 and less than or equal to 4 at a wavelength of 400 nm, and the extinction coefficient is preferably from 0.01 to 4, may be from 0.01 to 3.5, may be from 0.01 to 3, and may be from 0.1 to 1. The extinction coefficient (k) is $-\lambda/4\pi I$ (dI/dx) (herein, a value multiplying $\lambda/4\pi$ with dI/I, a reduced fraction of light intensity per a path unit length (dx), for example 1 m, in the light absorbing layer, and herein, $\lambda$ is a wavelength of light).

In one embodiment of the present specification, the light absorbing layer may have an extinction coefficient (k) of greater than 0 and less than or equal to 4 at a wavelength of 380 nm to 780 nm, and the extinction coefficient is preferably from 0.01 to 4, may be from 0.01 to 3.5, may be from 0.01 to 3, and may be from 0.1 to 1. The extinction coefficient (k) is in the above-mentioned range in the whole visible wavelength region of 380 nm to 780 nm and preferably at 400 nm, and therefore, a role of the light absorbing layer may be performed in the visible range.

Even with the same refractive index (n) value, a difference of >1 may be obtained when the extinction coefficient (k) is 0 and the extinction coefficient (k) is 0.01 at 380 nm to 780 nm. For example, when simulating a case of irradiating D65 (solar spectrum) as a light source on a laminated structure of glass/aluminum/aluminum oxide/air layer, Δa*b values are obtained as in the following Table 1 when the k values of the aluminum oxide are 0 and 0.01. Herein, the aluminum layer thickness (h1) is 120 nm, and the aluminum oxide layer thickness (h2) is described in the following Table 1. The k value is arbitrarily set to 0 and 0.01 for the simulation, and as the n value, the value of the aluminum is used.

TABLE 1

| h2 [nm] | k = 0 | | | k = 0.01 | | | ΔE*ab |
|---|---|---|---|---|---|---|---|
| | L* | a* | b* | L* | a* | b* | |
| 40 | 6.63 | 1.75 | −1.25 | 85.18 | 2.09 | 0.03 | 1.96 |
| 60 | 9.83 | −4.02 | −8.30 | 87.86 | −4.06 | −9.01 | 2.10 |
| 80 | 5.60 | −1.87 | −2.58 | 94.44 | −2.05 | −2.86 | 1.20 |

In one embodiment of the present specification, the light absorbing layer may be a single layer, or a multilayer of two or more layers. The light absorbing layer may be formed with materials having an extinction coefficient (k) at 380 nm to 780 nm, that is, materials having an extinction coefficient of greater than 0 and less than or equal to 4, and preferably 0.01 to 4. For example, the light absorbing layer may include one, two or more selected from the group consisting of metals, metalloids, and oxides, nitrides, oxynitrides and carbides of metals or metalloids. The oxides, nitrides, oxynitrides or carbides of metals or metalloids may be formed under a deposition condition and the like set by those skilled in the art. The light absorbing layer may also include the same metals, metalloids, alloys or oxynitrides of two or more types as the light reflective layer. In one embodiment of the present specification, the light absorbing layer is a single layer or a multilayer including one, two or more types of materials among one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), oxides thereof; nitrides thereof; oxynitrides thereof; carbon and carbon composites. In one embodiment of the present specification, the light absorbing layer includes silicon (Si) or germanium (Ge). The light absorbing layer formed with silicon (Si) or germanium (Ge) has a refractive index (n) of 0 to 8 at 400 nm, and the refractive index may be from 0 to 7. The light absorbing layer formed with silicon (Si) or germanium (Ge) may have an extinction coefficient (k) of greater than 0 and less than or equal to 4, preferably 0.01 to 4, and the extinction coefficient may be from 0.01 to 3 or from 0.01 to 1.

In one embodiment of the present specification, the light absorbing layer may be formed with materials having an extinction coefficient (k) at 400 nm, preferably at 380 nm to 780 nm, and for example, the light absorbing layer/light reflective layer may be formed with materials such as CuO/Cu, CuON/Cu, CuON/Al, AlON/Al, AlN/AL/AlON/Cu or AlN/Cu.

The light reflective layer is not particularly limited as long as it is a material capable of reflecting light, however, light reflectance may be determined depending on the material, and for example, colors are readily obtained at 50% or greater. Light reflectance may be measured using an ellipsometer.

In one embodiment of the present specification, the light reflective layer may be a metal layer, a metal oxynitride layer or an inorganic material layer. The light reflective layer may be formed in a single layer, or may also be formed in a multilayer of two or more layers.

As one example, the light reflective layer may be a single layer or a multilayer including one, two or more types of materials among one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), oxides, nitrides or oxynitrides thereof, carbon and carbon composites.

For example, the light reflective layer may include alloys of two or more selected from among the above-mentioned materials, or oxides, nitrides or oxynitrides thereof. For example, the light reflective layer may include alloys of two or more selected from among the above-mentioned metals. More specifically, the light reflective layer may include molybdenum, aluminum or copper. According to another embodiment, the light reflective layer may allow highly resistant reflective layer by being prepared using an ink including carbon or carbon composites. Carbon black, CNT and the like may be included as the carbon or carbon composites. The ink including carbon or carbon composites may include above-described materials, or oxides, nitrides or oxynitrides thereof, and for example, oxides of one, two or more types selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further performed after printing the ink including carbon or carbon composites.

When the light reflective layer includes two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink including carbon, and then curing the result. The ink may further include an oxide such as titanium oxide or silicon oxide.

According to one embodiment, the light absorbing layer may have a thickness of 5 nm to 500 nm, for example, 30 nm to 500 nm.

In one embodiment of the present specification, the thickness of the light reflective layer may be determined depending on target colors in a final structure, and for example, may be 1 nm or greater, preferably 25 nm or greater, for example, 50 nm or greater, and preferably 70 nm or greater.

In one embodiment of the present specification, the light absorbing layer may have various shapes by adjusting a deposition condition and the like when forming the light absorbing layer.

In one embodiment of the present specification, the light absorbing layer includes two or more points with different thicknesses.

In one embodiment of the present specification, the light absorbing layer includes two or more regions with different thicknesses.

In one embodiment of the present specification, the light absorbing layer may include an inclined surface.

Examples of the structure of the light absorbing layer according to the embodiment are illustrated in FIG. 39 and FIG. 40. FIG. 39 and FIG. 40 illustrate a structure in which a light reflective layer (201) and a light absorbing layer (301) are laminated (pattern layer and substrate not included).

According to FIG. 39 and FIG. 40, the light absorbing layer (301) has two or more points with different thicknesses. According to FIG. 39, thicknesses in A point and B point are different in the light absorbing layer (301). According to FIG. 40, thicknesses in C region and D region are different in the light absorbing layer (301).

In one embodiment of the present specification, the light absorbing layer includes one or more regions in which an upper surface has an inclined surface with an inclined angle of greater than 0 degrees and less than or equal to 90 degrees, and the light absorbing layer includes one or more regions having a thickness different from a thickness in the any one region having an inclined surface. As for the inclined surface, an angle formed by any one straight line included in an upper surface of the light absorbing layer and a straight line parallel to the light reflective layer may be defined as the inclined surface. For example, an inclined angle of an upper surface of the light absorbing layer of FIG. 39 may be approximately 20 degrees.

Surface properties such as an upper surface slope of the light reflective layer may be the same as an upper surface of the light absorbing layer. For example, by using a deposition method when forming the light absorbing layer, the upper surface of the light absorbing layer may have the same slope as the upper surface of the light reflective layer. However, the upper surface slope of the light absorbing layer of FIG. 39 is different from the upper surface slope of the light reflective layer.

FIG. 41 illustrates a structure of a decoration member having a light absorbing layer in which an upper surface has an inclined surface. The structure is a structure laminating a substrate (101), a light reflective layer (201) and a light absorbing layer (301), and thickness t1 in E region and thickness t2 in F region are different in the light absorbing layer (301).

FIG. 41 relates to a light absorbing layer having inclined surfaces facing each other, that is, having a structure with a triangular cross-section. In the structure of a pattern having inclined surfaces facing each other as in FIG. 41, a thickness of the light absorbing layer may be different in two surfaces having the triangular structure even when progressing deposition under the same condition. Accordingly, a light absorbing layer having two or more regions with different thicknesses may be formed using just one process. As a result, developed colors may become different depending on the thickness of the light absorbing layer. Herein, the thickness of the light reflective layer does not affect changes in the color when it is a certain thickness or greater.

FIG. 41 illustrates a structure in which a substrate (101) is provided on a light reflective layer (201) side, however, the structure is not limited thereto, and as described above, the substrate (101) may also be disposed on other locations.

In addition, in FIG. 42, the surface adjoining the light reflective layer (201) of the substrate (101) is a flat surface, however, the surface adjoining the light reflective layer (201) of the substrate (101) may have a pattern having the same slope as an upper surface of the light reflective layer (201). This is illustrated in FIG. 42. This may cause a difference in the thickness of the light absorbing layer as well due to a difference in the slope of the pattern of the substrate. However, the present disclosure is not limited thereto, and even when the substrate and the light absorbing layer are prepared to have different slopes using different deposition methods, dichroism may be obtained by having the thickness of the light absorbing layer being different on both sides of the pattern.

In one embodiment of the present specification, the light absorbing layer includes one or more regions with a gradually changing thickness. FIG. 43 illustrates a structure in which a thickness of the light absorbing layer (301) gradually changes.

In one embodiment of the present specification, the light absorbing layer includes one or more regions in which an upper surface has an inclined surface with an inclined angle of greater than 0 degrees and less than or equal to 90 degrees, and at least one or more of the regions having an inclined surface have a structure in which a thickness of the light absorbing layer gradually changes. FIG. 43 illustrates a structure of a light absorbing layer including a region in which an upper surface has an inclined surface. In FIG. 43, both G region and H region have a structure in which an upper surface of the light absorbing layer has an inclined surface, and a thickness of the light absorbing layer gradually changes.

In the present specification, the structure in which a thickness of the light absorbing layer changes means that a cross-section in a thickness direction of the light absorbing layer includes a point at which the light absorbing layer has a smallest thickness and a point at which the light absorbing layer has a largest thickness, and the thickness of the light absorbing layer increases along the direction of the point at which the light absorbing layer has a smallest thickness with respect to the point at which the light absorbing layer has a largest thickness. Herein, the point at which the light absorbing layer has a smallest thickness and the point at which the light absorbing layer has a largest thickness may mean any point on the interface of the light absorbing layer with the light reflective layer.

In one embodiment of the present specification, the light absorbing layer includes a first region having a first inclined surface with an inclined angle in a range of 1 degree to 90 degrees, and may further include two or more regions in which an upper surface has an inclined surface with a different slope direction or a different inclined angle from the first inclined surface, or an upper surface is horizontal. Herein, thicknesses in the first region and the two or more regions may all be different from each other in the light absorbing layer.

The decoration member according to another embodiment the present application further includes a color film provided between the pattern layer and the inorganic material layer; on a surface opposite to the surface facing the inorganic material layer of the pattern layer; or on a surface opposite to the surface facing the pattern layer of the inorganic material layer.

The decoration member according to another embodiment the present application further includes a color film provided between the pattern layer and the inorganic material layer; between the light absorbing layer and the light reflective layer; on a surface opposite to the surface facing the inorganic material layer of the pattern layer; or on a surface opposite to the surface facing the pattern layer of the inorganic material layer.

The color film is not particularly limited as long as it has a color difference ΔE*ab, a distance in space of L*a*b* in a color coordinate CIE L*a*b* of the color developing layer, of greater than 1 when the color film is present compared to when the color film is not provided.

Colors may be expressed by CIE L*a*b*, and a color difference may be defined using a distance (ΔE*ab) in L*a*b* space. Specifically, the color difference is $\Delta E^*ab = \sqrt{(\Delta L)^2 + (\Delta a)^2 + (\Delta b)^2}$, and within a range of 0<ΔE*ab<1, an observer may not recognize the color difference [reference document: Machine Graphics and Vision 20(4):383-411]. Accordingly, a color difference obtained by the color film addition may be defined by ΔE*ab>1 in the present specification.

By further providing such a color film, the range of obtainable colors may be further increased even when a material and a thickness of the inorganic material layer such as the light reflective layer and the light absorbing layer are determined. The range of color changes obtained by the color film addition may be defined by a color difference (ΔE*ab), a difference in L*a*b* before and after using the color film.

FIGS. 19(a)-19(e) illustrate positions of color film disposition. (however, convex structure and concave structure on pattern layer (101) surface, protective layer and substrate not shown).

FIG. 19(a) illustrates a structure in which the color film (401) is provided on a surface opposite to the light reflective layer (201) side of the light absorbing layer (301), FIG. 19(b) illustrates a structure in which the color film (401) is provided between the light absorbing layer (301) and the light reflective layer (201), FIG. 19(c) illustrates a structure in which the color film (401) is provided between the light reflective layer (201) and the pattern layer (101), and FIG. 19(d) illustrates a structure in which the color film (401) is provided on a surface opposite to the light reflective layer (201) side of the pattern layer (101). FIG. 19(e) illustrates a structure in which the color films (401a, 401b, 401c, 401d) are provided on a surface opposite to the light reflective layer (201) side of the light absorbing layer (301), between the light absorbing layer (301) and the light reflective layer (201), between the light reflective layer (201) and the pattern layer (101), and on a surface opposite to the light reflective layer (201) side of the pattern layer (101), respectively, however, the structure is not limited thereto, and 1 to 3 of the color films (401a, 401b, 401c, 401d) may not be included.

According to other embodiments of the present specification, positions of color film disposition in a structure consecutively provided with a light reflective layer (301) and a light absorbing layer (201) on a pattern layer (101) are illustrated in FIGS. 20(a)-20(e) (convex structure on pattern layer (101) surface not included).

FIG. 20(a) illustrates a structure in which the color film (401) is provided on a surface opposite to the light absorbing layer (301) side of the pattern layer (101), FIG. 20(b) illustrates a structure in which the color film (401) is provided between the pattern layer (101) and the light absorbing layer (301), FIG. 20(c) illustrates a structure in which the color film (401) is provided between the light absorbing layer (301) and the light reflective layer (201), and FIG. 20(d) illustrates a structure in which the color film (401) is provided on a surface opposite to the light absorbing layer (301) side of the light reflective layer (201). FIG. 20(e) illustrates a structure in which the color films (401a, 401b, 401c, 401d) are provided on a surface opposite to the light absorbing layer (201) side of the pattern layer (101), between the pattern layer (101) and the light absorbing layer (301), between the light absorbing layer (301) and the light reflective layer (201), and on a surface opposite to the light absorbing layer (201) side of the light reflective layer (201), respectively, however, the structure is not limited thereto, and 1 to 3 of the color films (401a, 401b, 401c, 401d) may not be included.

In the structures such as FIG. 19(b) and FIG. 20(c), the light reflective layer may reflect light entering through the color film when the color film has visible light transmittance of greater than 0%, and therefore, colors may be obtained by laminating the light absorbing layer and the light reflective layer.

In the structures such as FIG. 19(c), FIG. 19(d) and FIG. 20(d), light transmittance of the colors developed from the color film of the light reflective layer (201) may be 1% or greater, preferably 3% or greater and more preferably 5% or greater so that changes in the color difference obtained by the color film addition is recognized. This is due to the fact that light transmitted in such a visible light transmittance range may be mixed with colors obtained by the color film.

The color film may be provided as one sheet, or as a laminate of 2 sheets or more that are the same or different types.

As the color film, those capable of developing target colors by being combined with colors developed from the laminated structure of the light reflective layer and the light absorbing layer described above may be used. For example, color films expressing colors by dispersing one, two or more types of pigments and dyes into a matrix resin may be used. Such a color film may be formed by directly coating a composition for forming a color film on a color film-providable location, or a method of preparing a color film by coating a composition for forming a color film on a separate substrate or using a known molding method such as casting or extrusion, and then disposing or attaching the color film on a color film-providable location may be used. As the coating method, wet coating or dry coating may be used.

The pigment and the dye capable of being included in the color film may be selected from among those known in the art and capable of obtaining target colors from a final decoration member, and one, two or more types among pigments and dyes of red-based, yellow-based, purple-based, blue-based, pink-based and the like may be used. Specifically, dyes such as perinone-based red dyes, anthraquinone-based red dyes, methane-based yellow dyes, anthraquinone-based yellow dyes, anthraquinone-based purple dyes, phthalocyanine-based blue dyes, thioindigo-based pink dyes or isoxindigo-based pink dyes may be used either alone or as a combination. Pigments such as carbon black, copper phthalocyanine (C.I. Pigment Blue 15:3), C.I. Pigment Red 112, Pigment blue or isoindoline yellow may be used either alone or as a combination. As such dyes or pigments, those commercially available may be used, and for example, materials manufactured by Ciba ORACET or Chokwang Paint Ltd. may be used. Types of the dyes or pigments and colors thereof are for illustrative purposes only, and various known dyes or pigments may be used, and more diverse colors may be obtained therefrom.

As the matrix resin included in the color film, materials known as materials of transparent films, primer layers, adhesive layers or coating layers may be used, and the matrix resin is not particularly limited to these materials. For example, various materials such as acryl-based resins, polyethylene terephthalate-based resins, urethane-based resins, linear olefin-based resins, cycloolefin-based resins, epoxy-based resins or triacetylcellulose-based resins may be selected, and copolymers or mixtures of the materials illustrated above may also be used.

When the color film is disposed closer to the location observing the decoration member than the light reflective layer or the light absorbing layer as in, for example, the structures of FIGS. 19(a) and 19(b), and FIGS. 20(a), 20(b) and 20(c), light transmittance of the colors developed by the color film from the light reflective layer, the light absorbing layer or the laminated structure of the light reflective layer and the light absorbing layer may be 1% or greater, preferably 3% or greater and more preferably 5% or greater. As a result, target colors may be obtained by combining colors developed from the color film and colors developed from the light reflective layer, the light absorbing layer or the laminated structure thereof.

The thickness of the color film is not particularly limited, and those skilled in the art may select and set the thickness as long as it is capable of obtaining target colors. For example, the color film may have a thickness of 500 nm to 1 mm.

An exemplary decoration member and a method for preparing the decoration member may be used in known subjects requiring the use of a decoration member. For example, they may be used in portable electronic devices, electronic products, cosmetic containers, furniture, construction materials and the like without limit.

A manner of using the decoration member in portable electronic devices, electronic products, cosmetic containers, furniture, construction materials and the like is not particularly limited, and known methods known as a method of using a deco film in the art may be used. The decoration member may further include an adhesive layer as necessary. In another embodiment, the decoration member may be used by being directly coated on a portable electronic device or an electronic product. In this case, a separate adhesive layer for attaching the decoration member to the portable electronic device or the electronic product may not be required. In another embodiment, the decoration member may be attached to a portable electronic device or an electronic product using an adhesive layer as a medium. As the adhesive layer, an optically clear adhesive tape (OCA tape) or an adhesive resin may be used. As the OCA tape or the adhesive resin, OCA tapes or adhesive resins known in the art may be used without limit. As necessary, a peel-off layer (release liner) may be further provided for protecting the adhesive layer.

In one embodiment of the present specification, the substrate may include a plastic injection mold or a glass substrate for a cosmetic container.

In one embodiment of the present specification, the plastic injection mold may include one or more types of polypropylene (PP), polystyrene (PS), polyvinyl acetate (PVAc), polyacrylate, polyethylene terephthalate (PET), polyvinyl chloride (PVC), polymethyl methacrylate (PMMA), an ethylene-vinyl acetate copolymer (EVA), polycarbonate (PC), polyamide and a styrene-acrylonitrile copolymer.

In one embodiment of the present specification, a first direction color difference ($\Delta E_1$) represented by the following Equation 1 and a second direction color difference ($\Delta E_2$) represented by the following Equation 2 are each greater than 1.

$$\Delta E_1 = \sqrt{(L^*_1 - L^*_2)^2 + (a^*_1 - a^*_2)^2 + (b^*_1 - b^*_2)^2} \qquad \text{[Equation 1]}$$

$$\Delta E_2 = \sqrt{(L^*_3 - L^*_4)^2 + (a^*_3 - a^*_4)^2 + (b^*_3 - b^*_4)^2} \qquad \text{[Equation 2]}$$

In Equation 1 and Equation 2, the first direction color difference is a relation of ($L^*_1$, $a^*_1$, $b^*_1$) and ($L^*_2$, $a^*_2$, $b^*_2$) coordinates measured at two points on a straight line parallel to the first axis direction of the decoration member, and the second direction color difference is a relation of ($L^*_3$, $a^*_3$, $b^*_3$) and ($L^*_4$, $a^*_4$, $b^*_4$) coordinates measured at two points on a straight line perpendicular to the first axis direction of the decoration member.

When the first direction color difference ($\Delta E_1$) represented by Equation 1 and the second direction color difference ($\Delta E_2$) represented by Equation 2 are each 1 or greater, the first direction and the second direction may all exhibit dichroism. In other words, by dichroism appearing in two or more viewing directions, viewers may feel various colors.

In one embodiment of the present specification, the cosmetic container may be a cosmetic compact nameplate, but is not limited thereto.

In one embodiment of the present specification, the decoration member has surface resistance of 20 ohm/square or greater.

In one embodiment of the present specification, the decoration member has surface resistance of 1 gigaohm/square or greater, and more preferably 4 gigaohm/square or greater. In the above-mentioned range, an electromagnetic shielding effect may be maximized.

In the present specification, the surface resistance may be measured in accordance with a 4-point probe method using a known surface resistor. As for the surface resistance, a resistance value (V/I) is measured by measuring a current (I) and a voltage (V) using 4 probes, and by using an area (unit area, W) of a sample and a distance (L) between electrodes for measuring resistance, surface resistance is obtained (V/I×W/L), and then, a resistive corrector factor (RCF) is multiplied thereby to calculate as ohm/square, a surface resistance unit. The resistive corrector factor may be calculated using a sample size, a sample thickness and a temperature at the time of measurement, and may be calculated using the Poisson's equation.

One embodiment of the present specification provides a method for preparing a decoration member, the method including preparing a substrate; forming a pattern layer including a convex structure or a concave structure arranged two-dimensionally on one surface of the substrate; and forming an inorganic material layer provided on the pattern layer, wherein the two-dimensionally-arranged structure is arranged in a first axis direction and a second axis direction forming an angle of greater than or equal to 1 degree and less than or equal to 175 degrees in a clockwise direction with the first axis direction.

The method for preparing a decoration member according to one embodiment of the present specification includes forming a pattern layer including a convex structure or a concave structure arranged two-dimensionally on one surface of the substrate.

In one embodiment of the present specification, the forming of a pattern layer may be by coating a curable resin composition on the substrate, compressing the result with a mold having a target pattern, and then curing the result. The mold may have, for example, a flat plate shape or a roll shape. As the mold, a soft mold or a hard mold may be used, for example.

In one embodiment of the present specification, the forming of an inorganic material layer provided on the pattern layer may include depositing an inorganic material layer on a surface of the convex structure or the concave structure.

In one embodiment of the present specification, the forming of an inorganic material layer may use a sputtering method. Sputtering is a method in which an ion having energy (for example, $Ar^+$) gives an impact on a target material, and the target material coming off is deposited on a surface of a convex structure of a pattern layer. Herein, the base pressure may be $1.0 \times 10^{-5}$ torr or less, $6.0 \times 10^{-6}$ torr or less, and preferably $3.0 \times 10$–6 torr or less.

In one embodiment of the present specification, the sputtering method may be conducted in a chamber including a plasma gas and/or a reactive gas. The plasma gas may be argon (Ar) gas. In addition, the reactive gas is oxygen ($O_2$) and nitrogen ($N_2$), and is distinguished from the plasma gas as a gas for providing oxygen or nitrogen atoms.

In one embodiment of the present specification, in the forming of an inorganic material layer, a flow rate of the plasma gas may be greater than or equal to 10 sccm and less than or equal to 300 sccm, and preferably greater than or equal to 20 sccm and less than or equal to 200 sccm. The sccm means a standard cubic centimeter per minute.

In one embodiment of the present specification, a process pressure (p1) in the chamber may be from 1.0 mtorr to 10.0 mtorr, and preferably from 1.5 mtorr to 6 mtorr. When the process pressure is higher than the above-mentioned range during the sputtering, the number of Ar particles present in the chamber increases, and zinc oxide particles emitted from the target collide with the Ar particles losing energy, which may decrease a growth rate of a thin film. On the other hand, maintaining a process pressure too low has a disadvantage in that the substrate may be damaged due to particles having high energy, or qualities of the inorganic material layer may decline.

In one embodiment of the present specification, the reactive gas may have a fraction of greater than or equal to 30% and less than or equal to 70%, preferably greater than or equal to 40% and less than or equal to 70%, and more preferably greater than or equal to 50% and less than or equal to 70% with respect to the plasma gas. The fraction of the reactive gas may be calculated by ($Q_{reactive\ gas}$/($Q_{plasma\ process\ gas}+Q_{reactive\ gas}$)*100%). The $Q_{reactive\ gas}$ means a flow rate of the reactive gas in the chamber, and $Q_{plasma\ process\ gas}$ may be a flow rate of the plasma process gas in the chamber.

In one embodiment of the present specification, driving power of the sputtering method may be greater than or equal to 100 W and less than or equal to 500 W, and preferably greater than or equal to 150 W and less than or equal to 300 W.

In one embodiment of the present specification, a range of a voltage applied in the sputtering method may be greater than or equal to 350 V and less than or equal to 500 V. The voltage range may be adjusted depending on the state of the target, the process pressure, the driving power (process power) or the fraction of the reactive gas.

In one embodiment of the present specification, the deposition temperature of the sputtering method may be higher than or equal to 20° C. and lower than or equal to 300° C. When depositing at a temperature lower than the above-mentioned range, there is a problem in that particles coming off from the target and reaching the substrate have insufficient energy required for crystal growth decreasing crystallinity of thin film growth, and at a temperature higher than the above-mentioned range, particles coming off from the target evaporate or re-evaporate causing a problem of reducing a thin film growth rate.

Hereinafter, the present application will be specifically described with reference to examples, however, the scope of the present specification is not limited by the following examples.

EXAMPLES

Example and Comparative Example

Comparative Example 1 (One-Dimensional Asymmetric Pattern)

An ultraviolet-curable resin was coated on a PET substrate, and after compressing a hard mold having a one-dimensionally-arranged pattern thereto, the result was ultraviolet cured to form a one-dimensionally-arranged convex structure pattern. The pattern shape was formed in a structure of repeating the prism structure of FIG. 21, and an inclined angle of one side surface of the pattern was employed as 20°, and an inclined angle of the opposite side was employed as 70°. Herein, the pitch of the patterns was 47.1 micrometers, and the height of the pattern was 15.1 micrometers.

After that, an AlON light absorbing layer (Al: 57.9 at %, N: 36.8 at %, O: 5.3 at %) was deposited on the convex structure to a thickness of approximately 20 nm or 40 nm using a reactive sputtering method progressed by adding nitrogen ($N_2$) to argon (Ar) in an aluminum (Al) target-installed chamber.

After that, an Al light reflective layer was deposited on the light absorbing layer to a thickness of approximately 100 nm using a sputtering method using just argon (Ar). (at % means an atomic percent.)

Example 1 (Two-Dimensional Asymmetric Pattern: Angle 90 Degrees)

A decoration member was prepared in the same manner as in Comparative Example 1 except that, instead of the one-dimensionally-arranged convex structure pattern of Comparative Example 1, a two-dimensionally-arranged convex structure was formed by compressing a hard mold having a two-dimensionally-arranged pattern.

Herein, the angle formed by the first axis direction and the second axis direction of the two-dimensionally-arranged convex structure in a clockwise direction was 90 degrees. In addition, a mimetic diagram of the shape in which the convex structure was arranged is illustrated in FIG. 22, and a three-dimensional shape of the convex structure is illustrated in FIG. 23. In addition, changes in the brightness depending on the viewing direction were observed and are shown in FIG. 24.

Examples 2 to 11 (Two-Dimensional Asymmetric Pattern: Angle 90 Degrees)

The inclined angles of one side surface and the opposite side of the pattern were changed as in the following Table 2, and color coordinate values L*a*b* depending on the viewing direction were presented.

In each of the drawings, colors when looking at the decoration member in a viewing angle coordinate system are shown. The coordinate may be expressed by (θ, φ). When a vertical direction with respect to the surface direction of the decoration member is a z axis, and any one direction of the surface direction of the decoration member is an x axis, an angle formed by the z axis and the viewing direction is θ, and an angle formed by the x axis and the viewing direction is <p. When φ is 0 degrees (θ, 0), L*, a* and b* values depending on the changes in θ were measured. Details on the viewing angle coordinate system may refer to a literature IES type B Reference [IES-LM-75-01 Goniophotometer Types and Photometric Coordinates (title), IES (author), (Illuminating Engineering Society of North America, 2001)].

TABLE 2

| | Inclined Angle of One Side Surface | Inclined Angle of Opposite Side | Diagram |
|---|---|---|---|
| Example 2 | 10° | 80° | FIG. 25 |
| Example 3 | 12° | 78° | FIG. 26 |
| Example 4 | 14° | 76° | FIG. 27 |
| Example 5 | 16° | 74° | FIG. 28 |
| Example 6 | 18° | 72° | FIG. 29 |
| Example 7 | 22° | 68° | FIG. 30 |
| Example 8 | 24° | 66° | FIG. 31 |
| Example 9 | 26° | 64° | FIG. 32 |
| Example 10 | 28° | 62° | FIG. 33 |
| Example 11 | 30° | 60° | FIG. 34 |

Example 12 (Two-Dimensional Asymmetric Pattern: Angle 135 Degrees)

A decoration member was prepared in the same manner as in Comparative Example 1 except that a two-dimensionally-arranged convex structure was formed by compressing a hard mold having a two-dimensionally-arranged pattern.

Herein, the angle formed by the first axis direction and the second axis direction of the two-dimensionally-arranged convex structure in a clockwise direction was 135 degrees. In addition, a mimetic diagram of the shape in which the convex structure was arranged is illustrated in FIG. 35, and a three-dimensional shape of the convex structure is illustrated in FIG. 36. In addition, changes in the brightness depending on the viewing direction were observed and are shown in FIG. 37.

Experimental Example

CIE L*a*b* color coordinates of Comparative Example 1, Examples 1 and 2 were measured. Herein, a CM2600d colorimeter manufactured by Konica Minolta, Inc. was used. In addition, standard light D65 was used as a light source.

A first direction color difference ($\Delta E_1$) represented by the following Equation 1 and a second direction color difference ($\Delta E_2$) represented by the following Equation 2 were each measured.

$$\Delta E_1 = \sqrt{(L^*_1 - L^*_2)^2 + (a^*_1 - a^*_2)^2 + (b^*_1 - b^*_2)^2} \quad \text{[Equation 1]}$$

$$\Delta E_2 = \sqrt{(L^*_3 - L^*_4)^2 + (a^*_3 - a^*_4)^2 + (b^*_3 - b^*_4)^2} \quad \text{[Equation 2]}$$

The first direction color difference is a relation of ($L^*_1$, $a^*_1$, $b^*_1$) and ($L^*_2$, $a^*_2$, $b^*_2$) coordinates measured at two points on a straight line parallel to the first axis direction of the decoration member, and the second direction color difference is a relation of ($L^*_3$, $a^*_3$, $b^*_3$) and ($L^*_4$, $a^*_4$, $b^*_4$) coordinates measured at two points on a straight line perpendicular to the first axis direction of the decoration member.

Herein, 1 and 2 directions of FIG. 38 correspond to the first direction, and 3 and 4 directions correspond to the second direction.

1) Comparative Example 1 Observation on Decoration Member

When the light absorbing layer had a thickness of approximately 20 nm in the decoration member of Comparative Example 1, CIE L*a*b* color coordinates in each location were measured, and the results are shown in the following Table 3.

TABLE 3

| Measuring direction | L* | a* | b* | ΔE*ab (Measuring direction-Measuring direction) |
|---|---|---|---|---|
| 1 | $L^*_1 = 87.98$ | $a^*_1 = -0.49$ | $b^*_1 = 0.48$ | $\Delta E_1 = 24.70$ |
| 2 | $L^*_2 = 63.73$ | $a^*_2 = -1.25$ | $b^*_2 = 1.47$ | |
| 3 | $L^*_3 = 86.45$ | $a^*_3 = -0.47$ | $b^*_3 = 1.47$ | $\Delta E_2 = 0.89$ |
| 4 | $L^*_4 = 85.57$ | $a^*_4 = -0.5$ | $b^*_4 = 1.32$ | |

When the light absorbing layer had a thickness of 20 nm in Comparative Example 1, it was identified that ΔE*ab was large of 24.70 since 1 and 2 directions of the measuring direction coincided with the first axis direction of the pattern layer of the decoration member. On the other hand, ΔE*ab was 0.89, a value of less than 1, in 3 and 4 directions perpendicular to the first axis direction, and dichroism was difficult to identify with the human eye. In other words, dichroism appeared in measuring directions 1 and 2 only.

In addition, when the light absorbing layer had a thickness of approximately 40 nm in the decoration member of Comparative Example 1, CIE L*a*b* color coordinates in each location were measured, and the results are shown in the following Table 4.

TABLE 4

| Measuring direction | L* | a* | b* | ΔE*ab (Measuring direction-Measuring direction) |
|---|---|---|---|---|
| 1 | $L^*_1 = 34.9$ | $a^*_1 = 1.05$ | $b^*_1 = -2.95$ | $\Delta E_1 = 16.65$ |
| 2 | $L^*_2 = 50.03$ | $a^*_2 = -1.67$ | $b^*_2 = -9.34$ | |

TABLE 4-continued

| Measuring direction | L* | a* | b* | ΔE*ab (Measuring direction-Measuring direction) |
|---|---|---|---|---|
| 3 | $L^*_3 = 43.95$ | $a^*_3 = -0.59$ | $b^*_3 = -4.85$ | $\Delta E_2 = 0.79$ |
| 4 | $L^*_4 = 44.4$ | $a^*_4 = -0.67$ | $b^*_4 = -5.49$ | |

In Comparative Example 1, it was identified that ΔE*ab was large of 16.65 since 1 and 2 directions of the measuring direction coincided with the first axis direction of the pattern layer of the decoration member. On the other hand, ΔE*ab was 0.79, a value of less than 1, in 3 and 4 directions perpendicular to the first axis direction, and dichroism was difficult to identify with the human eye. In other words, dichroism appeared in measuring directions 1 and 2 only.

2) Example 1 Observation on Decoration Member

When the light absorbing layer had a thickness of approximately 20 nm in the decoration member of Example 1, CIE L*a*b* color coordinates in each location were measured, and the results are shown in the following Table 5. When the light absorbing layer had a thickness of approximately 20 nm in the decoration member of Example 1, it was identified that ΔE*ab values were respectively 13.53 and 12.18 in 1 and 2 directions and 3 and 4 directions, respectively the same as the first axis direction and the second axis direction of the pattern layer of the decoration member. In other words, it was identified that, unlike Comparative Example 1 in which the dichroism-appearing direction is limited to one direction, dichroism was developed to a similar degree in the two directions in Example 1.

TABLE 5

| Measuring direction | L* | a* | b* | ΔE*ab (Measuring direction-Measuring direction) |
|---|---|---|---|---|
| 1 | $L^*_1 = 73.09$ | $a^*_1 = -0.43$ | $b^*_1 = -0.29$ | $\Delta E_1 = 13.53$ |
| 2 | $L^*_2 = 86.59$ | $a^*_2 = -0.44$ | $b^*_2 = 0.62$ | |
| 3 | $L^*_3 = 85.88$ | $a^*_3 = -0.41$ | $b^*_3 = 0.71$ | $\Delta E_2 = 12.18$ |
| 4 | $L^*_4 = 73.75$ | $a^*_4 = -0.42$ | $b^*_4 = -0.44$ | |

In addition, when the light absorbing layer had a thickness of approximately 40 nm in the decoration member of Example 1, CIE L*a*b* color coordinates in each location were measured, and the results are shown in the following Table 6.

TABLE 6

| Measuring direction | L* | a* | b* | ΔE*ab (Measuring direction-Measuring direction) |
|---|---|---|---|---|
| 1 | $L^*_1 = 36.02$ | $a^*_1 = 1.05$ | $b^*_1 = -3.72$ | $\Delta E_1 = 12.43$ |
| 2 | $L^*_2 = 47.19$ | $a^*_2 = -1.8$ | $b^*_2 = -8.37$ | |
| 3 | $L^*_3 = 45.75$ | $a^*_3 = -1.04$ | $b^*_3 = -7.86$ | $\Delta E_2 = 9.64$ |
| 4 | $L^*_4 = 37.42$ | $a^*_4 = 0.59$ | $b^*_4 = -3.28$ | |

When the light absorbing layer had a thickness of approximately 40 nm in the decoration member of Example 1, it was identified that ΔE*ab values were respectively 12.43 and 9.64 in 1 and 2 directions and 3 and 4 directions, respectively the same as the first axis direction and the second axis direction of the pattern layer of the decoration member. In other words, it was identified that, unlike Comparative Example 1 in which the dichroism-appearing direction is limited to one direction, dichroism was developed to a similar degree in the two directions in Example 1.

3) Example 2 Observation on Decoration Member

When the light absorbing layer had a thickness of approximately 20 nm in the decoration member of Example 2, CIE L*a*b* color coordinates in each location were measured, and the results are shown in the following Table 7.

When the light absorbing layer had a thickness of approximately 20 nm in the decoration member of Example 2, it was identified that ΔE*ab values were respectively 7.94 and 17.40 in 1 and 2 directions and 3 and 4 directions, respectively the same as the first axis direction and the second axis direction of the pattern layer of the decoration member. It was identified that, unlike Comparative Example 1 in which the dichroism-appearing direction is limited, dichroism was developed in the two directions in Example 2. In addition, it was identified that, unlike Example 1 in which dichroism was developed to a similar degree in the two directions, Example 2 had a difference in the degree of dichroism appearing in the two directions.

TABLE 7

| Measuring direction | L* | a* | b* | ΔE*ab (Measuring direction-Measuring direction) |
|---|---|---|---|---|
| 1 | $L^*_1 = 80.6$ | $a^*_1 = 0.63$ | $b^*_1 = 0.99$ | $\Delta E_1 = 7.94$ |
| 2 | $L^*_2 = 88.53$ | $a^*_2 = -0.54$ | $b^*_2 = 1.46$ | |
| 3 | $L^*_3 = 88.61$ | $a^*_3 = -0.59$ | $b^*_3 = 0.67$ | $\Delta E_2 = 17.40$ |
| 4 | $L^*_4 = 71.29$ | $a^*_4 = -0.88$ | $b^*_4 = -0.98$ | |

When the light absorbing layer had a thickness of approximately 40 nm in the decoration member of Example 2, CIE L*a*b* color coordinates in each location were measured, and the results are shown in the following Table 8.

TABLE 8

| Measuring direction | L* | a* | b* | ΔE*ab (Measuring direction-Measuring direction) |
|---|---|---|---|---|
| 1 | $L^*_1 = 39.65$ | $a^*_1 = 1.68$ | $b^*_1 = -3.73$ | $\Delta E_1 = 7.00$ |
| 2 | $L^*_2 = 46.08$ | $a^*_2 = 1.13$ | $b^*_2 = -6.44$ | |
| 3 | $L^*_3 = 48.34$ | $a^*_3 = 0.2$ | $b^*_3 = -8.27$ | $\Delta E_2 = 18.51$ |
| 4 | $L^*_4 = 31.59$ | $a^*_4 = 3.42$ | $b^*_4 = -1.09$ | |

When the light absorbing layer had a thickness of approximately 40 nm in the decoration member of Example 2, it was identified that ΔE*ab values were respectively 7.00 and 18.51 in 1 and 2 directions and 3 and 4 directions, respectively the same as the first axis direction and the second axis direction of the pattern layer of the decoration member. It was identified that, unlike Comparative Example 1 in which the dichroism-appearing direction is limited, dichroism was developed in the two directions in Example 2. In addition, it was identified that, unlike Example 1 in which dichroism was developed to a similar degree in the two directions, Example 2 had a difference in the degree of dichroism appearing in the two directions.

The invention claimed is:

1. A decoration member comprising:
   a substrate;
   a pattern layer provided on one surface of the substrate and including a convex structure or a concave structure arranged two-dimensionally; and
   an inorganic material layer provided on the pattern layer,
   wherein the two-dimensionally-arranged structure is arranged in a first axis direction and a second axis direction forming an angle of greater than or equal to 1 degree and less than or equal to 175 degrees in a clockwise direction with the first axis direction,
   wherein the decoration member has surface resistance of 20 ohm/square or greater.

2. The decoration member of claim 1, wherein the two-dimensionally-arranged structure is arranged in the first axis direction and the second axis direction forming an angle of greater than or equal to 30 degrees and less than or equal to 150 degrees in the clockwise direction with the first axis.

3. The decoration member of claim 1, wherein the number of the convex structures or the concave structures is from 1/mm$^2$ to 1,000,000/mm$^2$ with respect to an area of a surface of the pattern layer.

4. The decoration member of claim 1, wherein any one or more of a cross-section cutting the convex structure or the concave structure in a first plane (Z1), and a cross-section cutting the convex structure or the concave structure in a second plane (Z2), have an asymmetric structure;
   the first plane includes a straight line parallel to the first axis direction, and the second plane includes a straight line parallel to the second axis direction; and
   the first plane and the second plane include a straight line passing through a highest point of the convex structure or a lowest point of the concave structure among normal lines on one surface of the substrate.

5. The decoration member of claim 4, wherein, in the asymmetric-structured cross-section, at least one cross-section includes two or more sides having different inclined angles, different curvatures, or different side shapes.

6. The decoration member of claim 4, wherein the asymmetric-structured cross-section includes a first inclined side and a second inclined side having different inclined angles.

7. The decoration member of claim 6, wherein an angle formed by the first inclined side and the second inclined side is 80 degrees to 100 degrees.

8. The decoration member of claim 6, wherein an inclined angle difference between the first inclined side and the second inclined side is 30 degrees to 70 degrees.

9. The decoration member of claim 4, wherein borders of the asymmetric-structured cross-section are a straight line, a curved line or a combination thereof.

10. The decoration member of claim 1, further comprising a flat portion between the convex structure or the concave structure arranged two-dimensionally.

11. The decoration member of claim 1, wherein a cross-section cutting the convex structure or the concave structure in a plane including the first axis direction and the second axis direction has a shape of square, rectangle or polygon.

12. The decoration member of claim 1, wherein the pattern layer has a flat portion on a surface opposite to the surface on which the convex structure or the concave structure is formed.

13. The decoration member of claim 1, wherein the inorganic material layer is a single layer or a multilayer including one, two or more types of materials among one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), oxides thereof; nitrides thereof; oxynitrides thereof; carbon and carbon composites.

14. The decoration member of claim 1, wherein the inorganic material layer includes a light absorbing layer and a light reflective layer consecutively provided on the pattern layer, or includes a light reflective layer and a light absorbing layer consecutively provided on the pattern layer.

15. The decoration member of claim 14, further comprising a color film provided between the pattern layer and the inorganic material layer; between the light absorbing layer and the light reflective layer; on a surface opposite to the surface facing the inorganic material layer of the pattern layer; or on a surface opposite to the surface facing the pattern layer of the inorganic material layer.

16. The decoration member of claim 1, further comprising a color film provided between the pattern layer and the inorganic material layer; on a surface opposite to the surface facing the inorganic material layer of the pattern layer; or on a surface opposite to the surface facing the pattern layer of the inorganic material layer.

17. The decoration member of claim 1, wherein a first direction color difference ($\Delta E1$) represented by the following Equation 1 and a second direction color difference ($\Delta E2$) represented by the following Equation 2 are each greater than 1:

$$\Delta E_1 = \sqrt{(L^*_1 - L^*_2)^2 + (a^*_1 - a^*_2)^2 + (b^*_1 - b^*_2)^2} \quad \text{[Equation 1]}$$

$$\Delta E_2 = \sqrt{(L^*_3 - L^*_4)^2 + (a^*_3 - a^*_4)^2 + (b^*_3 - b^*_4)^2}; \quad \text{[Equation 2]}$$

in Equation 1 and Equation 2,
   the first direction color difference is a relation of ($L^*_1$, $a^*_1$, $b^*_1$) and ($L^*_2$, $a^*_2$, $b^*_2$) coordinates measured at two points on a straight line parallel to the first axis direction of the decoration member; and
   the second direction color difference is a relation of ($L^*_3$, $a^*_3$, $b^*_3$) and ($L^*_4$, $a^*_4$, $b^*_4$) coordinates measured at two points on a straight line perpendicular to the first axis direction of the decoration member.

18. The decoration member of claim 1, which has surface resistance of 1 gigaohm/square or greater.

19. A method for preparing the decoration member of claim 1, the method comprising:
   preparing a substrate;
   forming a pattern layer including a convex structure or a concave structure arranged two-dimensionally on one surface of the substrate; and
   forming an inorganic material layer on the pattern layer,
   wherein the two-dimensionally-arranged structure is arranged in a first axis direction and a second axis direction forming an angle of greater than or equal to 1 degree and less than or equal to 175 degrees in a clockwise direction with the first axis direction.

* * * * *